(12) United States Patent
Sharon et al.

(10) Patent No.: US 11,244,732 B2
(45) Date of Patent: Feb. 8, 2022

(54) SINGLE PAGE READ LEVEL TRACKING BY BIT ERROR RATE ANALYSIS

(71) Applicant: Western Digital Technologies, Inc., San Jose, CA (US)

(72) Inventors: Eran Sharon, San Jose, CA (US); Alex Bazarsky, San Jose, CA (US); Idan Alrod, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 3 days.

(21) Appl. No.: 16/364,347

(22) Filed: Mar. 26, 2019

(65) Prior Publication Data

US 2020/0105353 A1    Apr. 2, 2020

Related U.S. Application Data

(60) Provisional application No. 62/738,710, filed on Sep. 28, 2018.

(51) Int. Cl.

| | | |
|---|---|---|
| *G11C 16/34* | (2006.01) | |
| *G11C 29/02* | (2006.01) | |
| *G11C 29/50* | (2006.01) | |
| *G11C 11/56* | (2006.01) | |
| *G06F 11/07* | (2006.01) | |
| *G11C 7/14* | (2006.01) | |
| *G11C 16/28* | (2006.01) | |

(52) U.S. Cl.
CPC ........ *G11C 16/3404* (2013.01); *G06F 11/076* (2013.01); *G11C 7/14* (2013.01); *G11C 11/5642* (2013.01); *G11C 16/28* (2013.01); *G11C 16/3445* (2013.01); *G11C 16/3495* (2013.01); *G11C 29/028* (2013.01); *G11C 29/50004* (2013.01); *G11C 2207/2254* (2013.01)

(58) Field of Classification Search
CPC .............. G11C 16/3404; G11C 29/028; G11C 29/50004; G11C 11/5642; G11C 16/3445; G11C 16/3495; G11C 7/14; G11C 16/28; G11C 2207/2254; G06F 11/076

See application file for complete search history.

(56) References Cited

U.S. PATENT DOCUMENTS

| | | | | |
|---|---|---|---|---|
| 8,099,652 | B1 * | 1/2012 | Alrod ................. | G06F 11/1072 714/763 |
| 9,368,225 | B1 * | 6/2016 | Pinkovich .............. | G11C 16/26 |
| 2010/0091535 | A1 * | 4/2010 | Sommer ................ | G11C 16/28 365/45 |
| 2010/0131827 | A1 * | 5/2010 | Sokolov ............. | G06F 11/1044 714/763 |

(Continued)

*Primary Examiner* — Khamdan N. Alrobaie

(74) *Attorney, Agent, or Firm* — Dickinson Wright PLLC; Steven Hurles

(57) ABSTRACT

A method for calibrating read threshold voltages includes receiving, from at least one memory die, a number of page bits corresponding to a number of read operations performed on a page associated with the at least one memory die. The method further includes determining voltage bins for each bit of the number of page bits. The method further includes determining, for each voltage bin, a bit error rate. The method further includes adjusting read threshold voltages associated with the at least one memory die using the bite error rate for each voltage bin.

20 Claims, 17 Drawing Sheets

(56) References Cited

U.S. PATENT DOCUMENTS

| | | | | |
|---|---|---|---|---|
| 2011/0258496 | A1* | 10/2011 | Tseng | G11C 16/10 |
| | | | | 714/704 |
| 2012/0008386 | A1* | 1/2012 | Chilappagari | G11C 16/26 |
| | | | | 365/185.2 |
| 2012/0213004 | A1* | 8/2012 | Yun | G11C 11/5642 |
| | | | | 365/185.11 |
| 2013/0094289 | A1* | 4/2013 | Sridharan | G11C 11/5628 |
| | | | | 365/185.03 |
| 2014/0095110 | A1* | 4/2014 | Chen | G11C 29/021 |
| | | | | 702/179 |
| 2014/0321204 | A1* | 10/2014 | Yang | G11C 16/10 |
| | | | | 365/185.03 |
| 2016/0041891 | A1* | 2/2016 | Malshe | G06F 11/1048 |
| | | | | 714/704 |
| 2017/0117053 | A1* | 4/2017 | Sharon | G11C 16/3418 |
| 2018/0159560 | A1* | 6/2018 | Sharon | G06F 3/067 |
| 2019/0189202 | A1* | 6/2019 | Avraham | G11C 29/028 |
| 2020/0105353 | A1* | 4/2020 | Sharon | G11C 16/3404 |

* cited by examiner

If $BER_{1\to 0} > BER_{0\to 1}$, move left

If $BER_{1\to 0} < BER_{0\to 1}$, move right

US 11,244,732 B2

SINGLE PAGE READ LEVEL TRACKING BY BIT ERROR RATE ANALYSIS

RELATED APPLICATION DATA

This application claims priority to U.S. Provisional Application No. 62/738,710, filed on Sep. 28, 2018, the entire disclosure of which is hereby incorporated by reference as if set forth fully herein.

TECHNICAL FIELD

This disclosure relates to memory systems, and in particular, to methods and systems for single page read level tracking using bit error rate analysis.

SUMMARY

This disclosure relates generally to memory management systems and methods.

An aspect of the disclosed embodiments is a method for calibrating read threshold voltages. The method includes receiving, from at least one memory die, a number of page bits corresponding to a number of read operations performed on a page associated with the at least one memory die. The method further includes determining voltage bins for each bit of the number of page bits. The method further includes determining, for each voltage bin, a bit error rate. The method further includes adjusting read threshold voltages associated with the at least one memory die using the bite error rate for each voltage bin.

Another aspect of the disclosed embodiments is a memory system that includes a non-volatile storage and a controller. The non-volatile storage includes at least one memory die and the controller is in communication with the at least one memory die. The controller is configured to: receive, from the at least one memory die, a number of page bits corresponding to a number of read operations performed on a page associated with the at least one memory die; determine voltage bins for each bit of the number of page bits; determine, for each voltage bin, a bit error rate; and adjust read threshold voltages associated with the at least one memory die using the bite error rate for each voltage bin.

Another aspect of the disclosed embodiments is a system for calibrating read threshold voltages. The system includes a controller in communication with at least one memory die. The controller is configured to: receive, from the at least one memory die, a number of page bits corresponding to a number of read operations performed on a page associated with the at least one memory die, wherein the read operations include existing host read operations; determine voltage bins for each bit of the number of page bits; determine, for each voltage bin, a bit error rate; and adjust read threshold voltages associated with the at least one memory die using a Gaussian tail distribution function and the bit error rate for each voltage bin, wherein each voltage bin corresponds to a respective read threshold voltage.

These and other aspects of the present disclosure are disclosed in the following detailed description of the embodiments, the appended claims, and the accompanying figures.

BACKGROUND

One of the challenges introduced by NAND process shrinking and 3D stacking is maintaining process uniformity. This leads to increased variability between memory dies, blocks, and pages and across different endurance, retention, temperature, and disturbance conditions. Operation under such diverse conditions requires using an adaptive system, especially in terms of tracking the optimal read thresholds in order to ensure that the read throughput and IOPS requirements are met and to ensure QoS (Quality of Service).

One of the common solutions for this problem is to track the read levels of groups of blocks that exhibit similar conditions (e.g., were programmed at substantially the same time). Assuming the controller implements a wear leveling mechanism, then all blocks are expected to have roughly the same P/E count (PEC), hence, all the blocks within such a group are expected to have similar optimal read thresholds (as they have roughly the same P/E count and were programmed at roughly the same time and temperature). This allows the controller to maintain a set of read thresholds per group (instead of per Block, or WL or Page).

In order to maintain updated read thresholds, the controller may need to run a background process, which will periodically estimate and tune the optimal read thresholds per group blocks.

This update background process may be triggered either periodically at some predefined elapsed time or triggered by a high Bit Error Rate (BER) indication. Once triggered, the background process may traverse the groups, chooses one or more WLs or Pages from each group, and estimates the optimal read thresholds of the representative WLs/Pages, which may serve as the read thresholds that will be used for reading the WLs/Pages of the group. The estimation of optimal read thresholds of the representative WLs/Pages may be done using various algorithms, such as algorithms that generate a histogram of the Cell Voltage Distribution (CVD) and find the valley points of the histogram which will serve as the read thresholds, or algorithms that rely on the ECC feedback in order to identify the read thresholds that minimize the BER. These read thresholds estimation methods incur relatively high latency penalty, as they require performing multiple reads. The number of reads to calibrate a page may be larger (e.g., 5, 7, 9, or more), in order to cover a large voltage range.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Figure 1A:
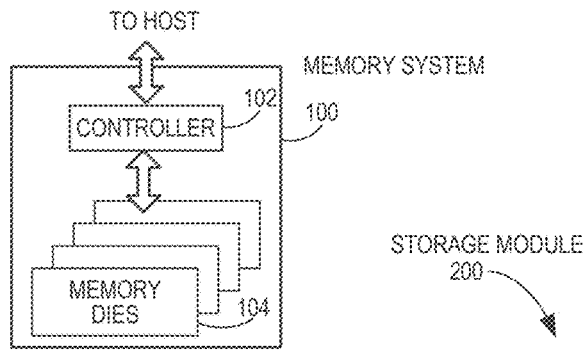
FIG. 1A generally illustrates a block diagram of an example memory system.

FIG. 1A generally illustrates a block diagram illustrating a memory system 100.

The memory system 100 may include a controller 102 and memory that may include or be made up of one or more memory dies 104. As used herein, the term die refers to the set of memory cells, and associated circuitry for managing the physical operation of those memory cells, that are formed on a single semiconductor substrate. The controller 102 may interface with a host system and transmit command sequences for read, program, and erase operations to the non-memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and generally illustrated in the flow diagrams. Additionally, or alternatively, some of the components shown as being internal to the controller can also be stored external to the controller, and other components can be used. Additionally, or alternatively, the phrase "operatively in communication with" could mean directly in communication with or indirectly (wired or wireless) in communication with through one or more components, which may or may not be generally illustrated or described herein.

As used herein, the controller 102 is a device that manages data stored in the memory die(s) and communicates with a host, such as a computer or electronic device. The controller 102 can have various functionality in addition to the specific functionality described herein. For example, the controller 102 can format the memory dies 104 to ensure the memory dies 104 are operating properly, map out bad flash memory cells, and allocate spare cells to be substituted for future failed cells. Some part of the spare cells can be used to hold firmware to operate the controller 102 and implement other features. In operation, when a host needs to read data from or write data to the memory die(s) 104, the host will communicate with the controller 102. If the host provides a logical address to which data is to be read/written, the controller 102 can convert the logical address received from the host to a physical address in the memory die(s) 104. (Alternatively, the host can provide the physical address). The controller 102 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable interface, such as flash interface, including those configured for Toggle Mode 200, 400, 800, 1000 or higher. For some example embodiments, the memory system 100 may be a card based system, such as a secure digital (SD) or a micro secure digital (micro-SD) card. In alternate example embodiments, the memory system 100 may be part of an embedded memory system.

In the example illustrated in FIG. 1A, the memory system 100 is generally illustrated as including a single channel between the controller 102 and the non-volatile memory die(s) 104. However, the subject matter described herein is not limited to memory systems having a single memory channel. For example, in some memory systems, such as those embodying NAND architectures, 2, 4, 8 or more channels may exist between the controller 102 and the memory die(s) 104, depending on controller capabilities. In any of the embodiments described herein, more than a single channel may exist between the controller and the memory die(s) 104, even if a single channel is shown in the drawings.

Figure 1B:
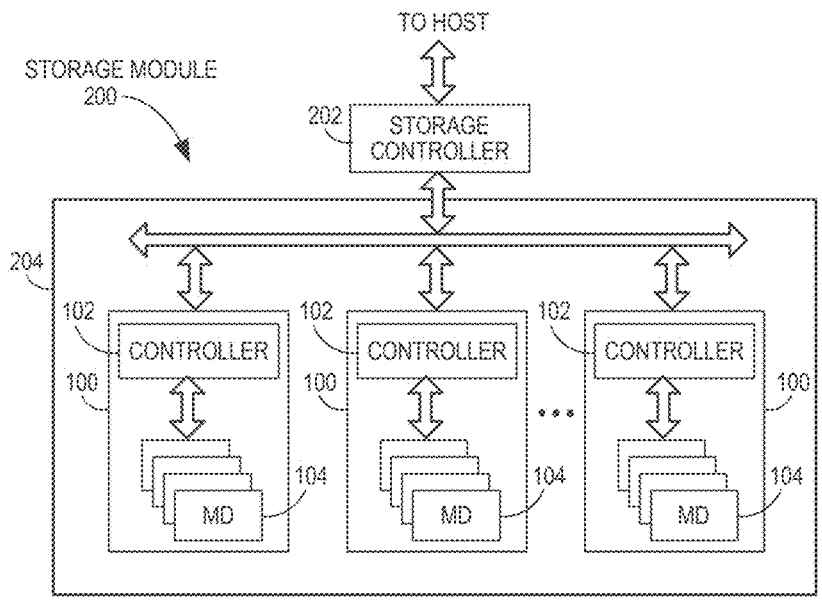
FIG. 1B generally illustrates a block diagram of an example storage module that includes a plurality of memory systems.

FIG. 1B illustrates a storage module 200 that includes a plurality of non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded Multimedia Card (eMMC) interface, a SD interface, or a Universal Serial Bus (USB) interface, as examples. The storage module 200, in one embodiment, may be a solid state drive (SSD), such as found in portable computing devices, such as laptop computers and tablet computers, and mobile phones.

Figure 1C:
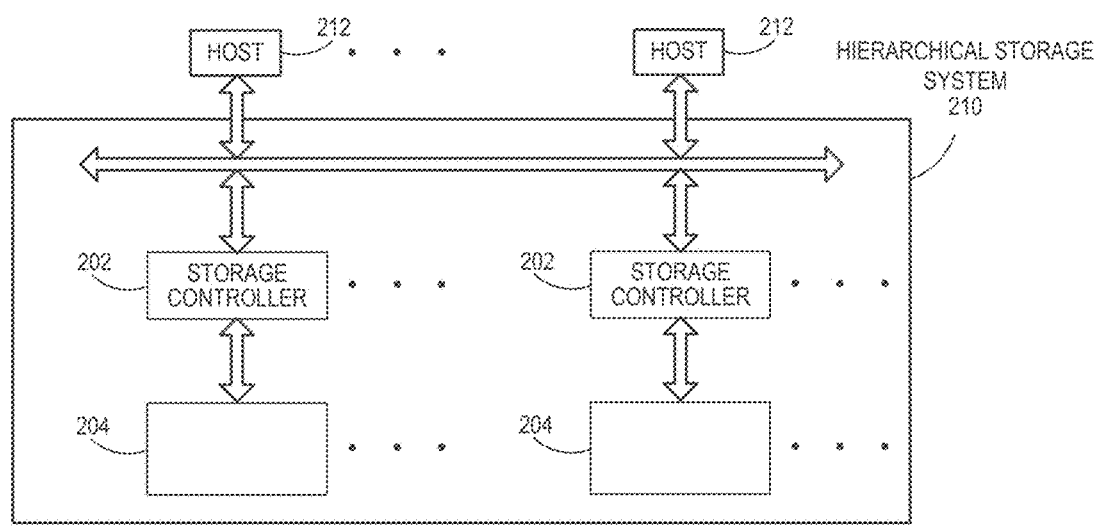
FIG. 1C generally illustrates a block diagram of an example hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
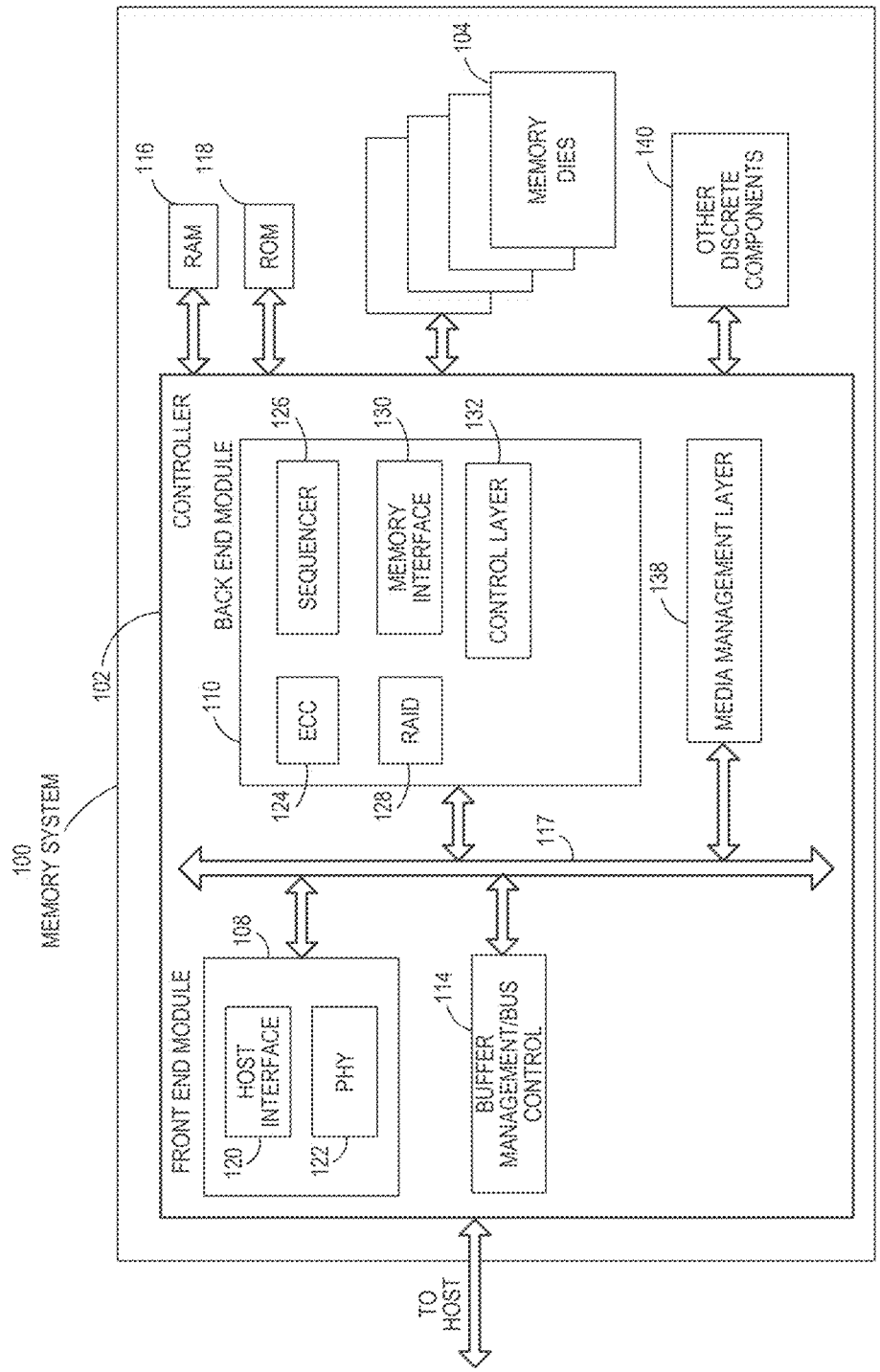
FIG. 2A generally illustrates a block diagram of an example configuration of components of a controller of the memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, or alternatively, the front-end module 108 may include a host interface 120 and a physical layer interface (PHY) 122 that provide the electrical interface with the host or next level storage controller. The choice of the type of the host interface 120 can depend on the type of memory being used. Example types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction code (ECC) engine or module 124 that encodes the data bytes received from the host, and decodes and error corrects the data bytes read from the non-volatile memory die(s) 104. The back end module 110 may also include a command sequencer 126 that generates command sequences, such as program, read, and erase command sequences, to be transmitted to the non-volatile memory die(s) 104. Additionally, or alternatively, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface and/or a Toggle Mode 200, 400, 800, or higher interface. A control layer 132 may control the overall operation of back end module 110.

Additional modules of the non-volatile memory system 100 illustrated in FIG. 2A may include a media management layer 138 that performs certain memory management functions such as wear leveling of memory cells of the memory dies 104, address management, and facilitates folding operations. Other memory management functions may be possible. The non-volatile memory system 100 may also include other discrete components 140, such as external electrical interfaces, external RAM, resistors, capacitors, or other components that may interface with the controller 102. In alternative embodiments, one or more of the RAID module 128, media management layer 138 and buffer management/bus controller 114 are optional components that may not be necessary in the controller 102.

Figure 2B:
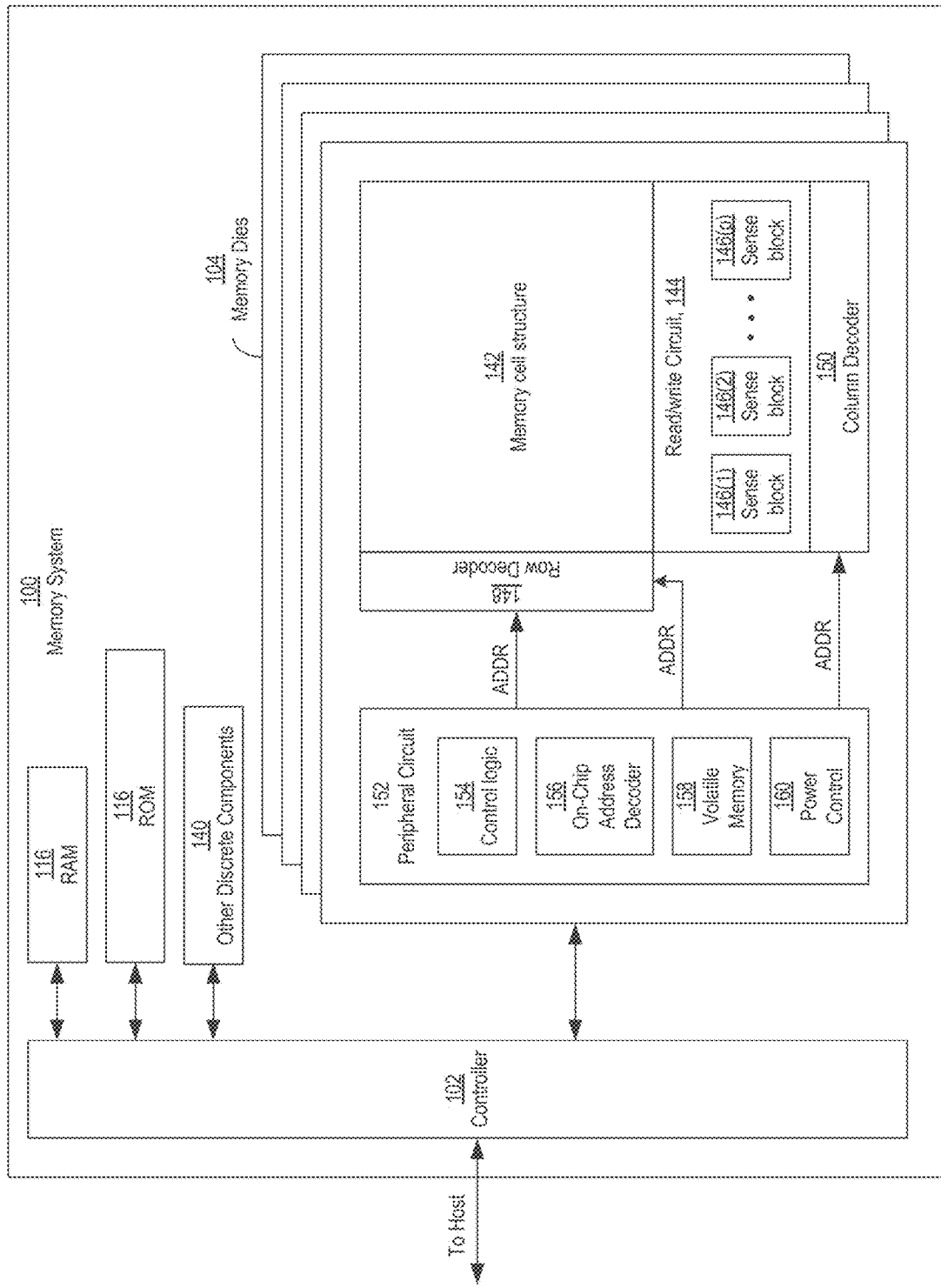
FIG. 2B generally illustrates a block diagram of an example configuration of components of a memory die of the memory system of FIG. 1A.

FIG. 2B is a block diagram of an example configuration of components of a memory die 104 in more detail. The memory die 104 may include a memory cell structure 142 that includes a plurality of memory cells, otherwise or interchangeably referred to as memory elements. A memory cell is an element or component that stores a unit of data having an n-bit data value, where n is on or more. Any suitable type of memory can be used for the memory cells of the memory cell structure 142. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor material or other material capable of storing information. Each type of memory may have different configurations. For example, flash memory may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further, by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory cells may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple cell groups, where the memory cells that are part of the same cell group share a single bias line, such as a single word line or a single bit line, and are accessed or biased as a group. Alternatively, memory cells may be configured so that each element is individually accessible, e.g., a NOR memory array. NAND and NOR memory configurations are exemplary, and memory cells may be otherwise configured.

A plurality of memory cells that form the memory cell structure 142 of a memory die may be located within and/or over a substrate. The substrate may be a wafer over, in which the layer of the memory cells are formed, or it may be a carrier substrate, which is attached to the memory cells after they are formed. As a non-limiting example, the substrate may include a semiconductor and/or be made of a semiconductor material, such as silicon.

In addition, a plurality of memory cells that form the entire memory cell structure 142, or at least a portion of the memory cell structure 142, may be arranged in two dimensions or in three dimensions. A plurality of memory cells arranged in two dimensions is referred to as a two-dimensional (2-D) memory cell structure. A plurality of memory cells arranged in three dimensions is referred to as a three-dimensional (3-D) memory cell structure.

In a two-dimensional memory cell structure, the memory cells are arranged in a single plane or a single memory device level. Typically, in a two dimensional memory cell structure, the memory cells are arranged in a plane (e.g., in an x-y direction plane) that extends substantially parallel to a major surface of a substrate that supports the memory cells.

In a three-dimensional memory cell structure, the memory cells are arranged so that memory cells occupy multiple planes or multiple memory device levels (e.g., multiple x-y direction planes), thereby forming a structure in three dimensions (i.e., in the x, y and z directions, where the z direction is substantially perpendicular to and the x and y directions are substantially parallel to the major surface of the substrate). When configured as a three-dimensional memory cell structure, the memory cells extend up or away from the major surface of the substrate.

As a non-limiting example, a three dimensional memory structure may be vertically arranged as a stack of multiple two dimensional memory device levels. As another non-limiting example, a three-dimensional memory array may be arranged as multiple vertical columns (e.g., columns extending substantially perpendicular to the major surface of the substrate, i.e., in the z direction) with each column having multiple memory cells in each column. The columns may be arranged in a two-dimensional configuration, e.g., in an x-y plane, resulting in a three-dimensional arrangement of memory cells, with the memory cells on multiple vertically stacked memory planes. Other configurations of memory cells in three dimensions can also constitute a three dimensional memory array.

In at least some example configurations, a two-dimensional or a three-dimensional memory cell structure may be in the form of or configured as an ordered array (or just array). One type of an array is an orthogonal array, which is a matrix-like structure that includes rows and columns. The memory cells are arranged in the rows and columns. At the intersection of a row and a column is a memory cell. However, in other configurations, the memory cells may be arrayed in non-regular or non-orthogonal configurations.

Figure 3A:
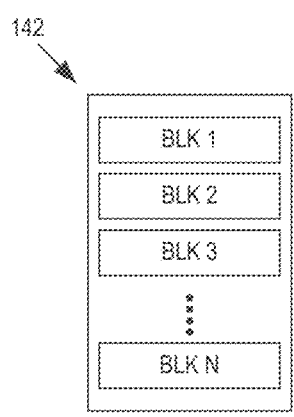
FIG. 3A generally illustrates a block diagram of a memory cell structure organized into blocks.

Referring to FIG. 3A, the memory cells of the memory cell structure 142 located on a single memory die 104 may be organized into an N-number of blocks, extending from a first block BLK 1 to an Nth block BLK N. A block is a minimum unit of erase of a memory die 104. Memory cells that are part of the same block are erased at the same time and/or as part of a same erase operation.

Figure 3B:
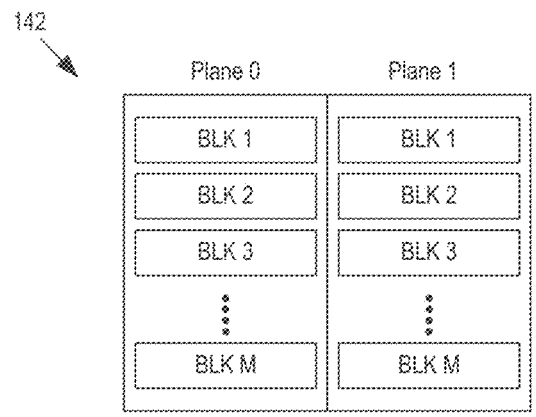
FIG. 3B generally illustrates a block diagram of a memory cell structure organized into blocks in different memory planes.

Referring to FIG. 3B, for some example configurations, the N-number of blocks located on a single memory die 104 are organized into a plurality of memory planes (or just planes). FIG. 3B generally illustrates an example configuration where the blocks are organized into two memory planes, including a first memory plane, Plane 0, and a second memory plane, Plane 1. Configurations that include more than two memory planes may be possible. In FIG. 3B, each memory plane is shown as including an M-number of blocks, extending from a first block BLK 1 to an Mth block BLK M. In at least some example configurations, blocks that are part of the same plane may be oriented in and/or form a column or a one-dimensional array of blocks, although other configurations of blocks in a single plane may be possible.

The memory cells of a block may be arranged two-dimensionally in a two-dimensional (2-D) memory array or three-dimensionally in a three-dimensional (3-D) memory array. A two-dimensional block is a block that has memory cells arranged two-dimensionally. A three-dimensional block is a block that has memory cells arranged three-dimensionally.

Figure 4A:
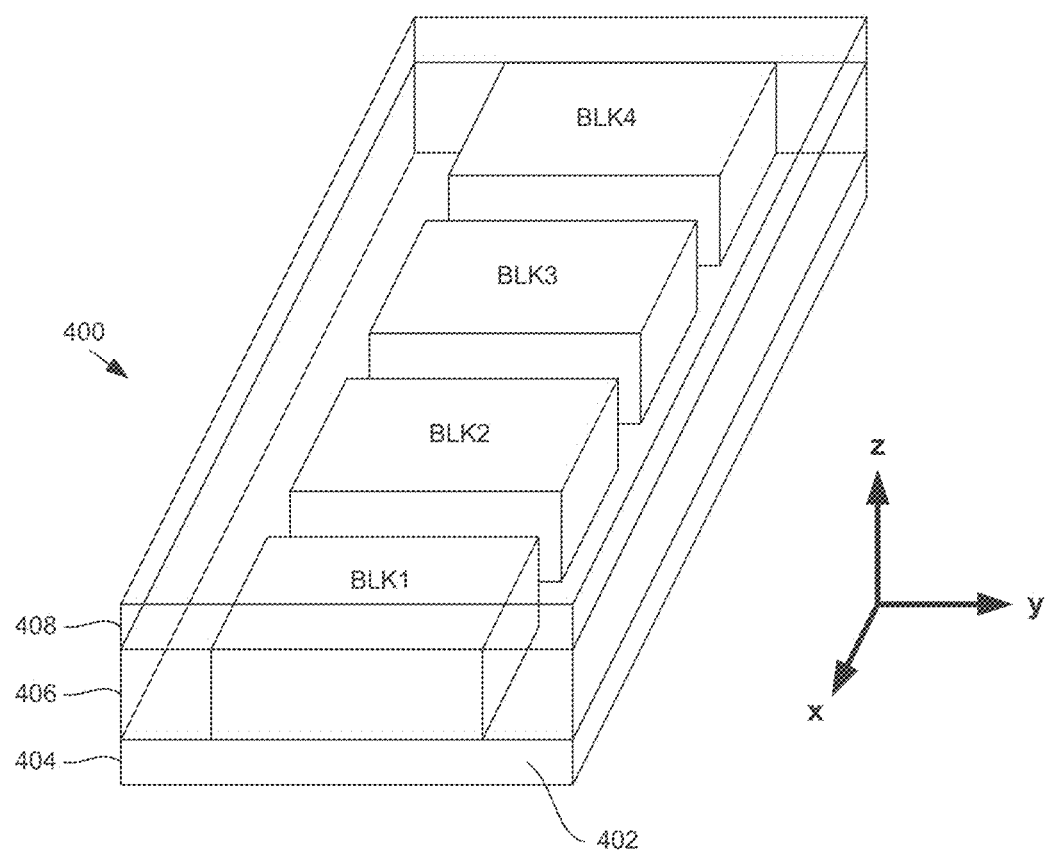
FIG. 4A generally illustrates a perspective view of at least a portion of the memory die of FIG. 2B that includes a plurality of three-dimensional blocks.

FIG. 4A generally illustrates a perspective view of at least a portion of a memory die 104 that includes a set or a plurality of three-dimensional blocks 400, which may represent at least a portion of the memory cell structure 142 of FIG. 2B. For simplicity, the plurality of blocks 400 is generally illustrates as including four blocks, BLK1, BLK2, BLK3, and BLK4. In actual implementation, a given memory cell structure 142 of a memory die 104 may include several more blocks than four, such as on the order of hundreds, thousands, or tens of thousands of blocks. In a particular example configuration, one plane of blocks includes 2,000 blocks.

The blocks 400 are located or disposed on a substrate 402 of the memory die 104. The substrate 402 may be part of a lower level or region 404 of the memory die 104 that carries or includes circuitry under the blocks 400, along with one or more lower metal layers patterned to form conductive paths that carry or supply signals or voltages output from the circuitry, such as those used to perform memory operations (read, program, sense, erase, e.g.).

The blocks 400 are disposed in an intermediate level or region 406 (also referred to as a block level or region, or an array level or region) of the memory die 104 in between the lower region 404 and an upper level or region 408 of the memory die 104. The upper region 408 may include one, more upper metal layers patterned in the form of conductive paths that carry or supply signals, or voltages output from the circuitry.

The substrate 402 is generally a planar structure having opposing planar surfaces. Herein, the components on a memory die 104 can be physically described with reference to a three-dimensional Cartesian coordinate system having an x-axis, a y-axis, and a z-axis. The z-axis is the axis that extends perpendicular to the planar surfaces of the substrate 402. In general, the components on a memory die 104 are disposed on and/or extend from one of the planar surfaces in a z-direction that is parallel with the z-axis. The terms "above" and "below" as well as other terms such as "top" and "bottom" and "upper" and "lower" are used herein to describe relative positioning of components of the memory die 104 along or with reference to the z-axis. For example, the blocks 400 are "above" the substrate 402, and the substrate 402 is part of the lower region 404 that is "below" the blocks 400. In addition, the upper region 408 is a region of the memory die 104 "above" both the blocks 400 and the substrate 402. Components of the memory die 104 disposed in the upper region 408 are farther away in the z-direction from the substrate 402 than components of the blocks 400. In general, for two components on a given memory die 104, where the first component is "above" the second component, the first component is positioned or disposed farther in the z-direction from the substrate 402 than the second component. In addition, where the first component is "below" the second component, the first component is positioned or disposed closer in the z-direction to the substrate 402 than the second component.

The terms "top" and "bottom" are also used to refer to the relative positioning of components of the memory die 104 in the z-direction and/or along the z-axis. In general, "bottom" components are positioned or disposed closer in the z-direction to the substrate 402 than "top" components, and "top" components are positioned or disposed farther in the z-direction from the substrate 402 than "bottom" components. In this context, a memory die 104 may include one or more top metal layers disposed in the upper region 408 and one or more bottom metal layers disposed in the lower region 404. In general, the bottom metal layers are positioned or disposed closer in the z-direction to the substrate 402 than the top metal layers, and the top metal layers are positioned or disposed farther in the z-direction from the substrate 402 than the bottom metal layers.

Although the terms "upper" and "lower," "above" and "below," and "top" and "bottom" are used to describe the relative position of components on a memory die 104, they should not be construed as limiting the relative positioning of the components since a memory die 104, or the memory system 100 as a whole, can be oriented in any of various positions.

With respect to the components of a block, a block includes a plurality of bias elements and a plurality of control lines. A bias element is a component or unit of a block that receives, is biased with, and/or that responds to a bias. A bias, as used in conjunction with a bias element of a block, is a voltage, a current, a plurality of voltages, a plurality of currents, or a combination of at least one voltage and at least one current that is applied to and/or received by the bias element to cause a response from the bias element or configure the bias element in a particular state. A bias is applied or supplied to the bias element, or the bias element is biased with the bias, at one or more levels to induce a response or configure the bias element in a particular state in order for a memory operation to be carried out.

The plurality of bias elements of a block may all be of a single type or may each be one of a plurality of different types. Bias elements of different types may perform different functions in the block and/or may be biased with different biases at different levels during the memory operations.

One type of bias element is a memory cell. Memory cells that are part of the same block are referred to as a block of memory cells. Other types of bias elements may be possible, depending on the memory technology. In NAND technology, other types bias elements may include dummy cells, drain select gate transistors (referred to as SGD transistors), and source select gate transistors (referred to as SGS transistors). At least with NAND technology, dummy cells are memory cells that do not store data from a host, and are disposed coplanar with dummy word line layers that shield memory cells and word line layers from certain edge effects. SGD transistors and SGS transistors may be configured to enabled (turn on) and disabled or inhibited (turn off), or otherwise configured in conductive and non-conductive states, at certain time and/or in response to certain biases to allow memory operations to be performed—e.g., to allow data to be programmed into, read from, or erased from the memory cells. Bias element types other than or in addition to memory cells, dummy cells, SGD transistors, and/or SGS transistors may be possible.

In addition, a control line of a block is a conductive structure, element, or component of a block that supplies, applies, or outputs at least a part of a bias (such as a single voltage or a single current) to one or more bias elements of a block and/or that biases the one or more bias elements with at least part of the bias. In at least some example configurations, a control line functions as a contact line, in that it is the conductive line that physically extends to and contacts the one or more bias elements it biases, such as by contacting and/or forming at least a part of the electrodes or terminals of the bias element that it biases.

The control lines of a block may be organized, arranged, characterized, divided, or configured into a plurality of different types of control lines. The control lines may be organized into types by the way that they bias the bias elements. For example, control lines of the same type may bias the bias elements in the same way, such as by biasing type of bias elements and/or the same types of terminals of the bias elements.

For NAND technology, the control lines of a block may be organized into three main types, including control gate lines, bit lines, and source lines. A control gate line (at least for NAND technology) is a control line that applies a control gate voltage to one or more control gate terminals (or just control gate) of one or more bias elements, and/or that biases one or more control gate terminals of one or more bias elements with a control gate voltage.

A bit line (at least for NAND technology) is a control line that applies a bit line voltage to one or more drain terminals (or just drain) of one or more bias elements, and/or that biases one or more drain terminals of one or more bias elements with a bit line voltage. In this context, the bit line voltage may alternatively be referred to as a drain voltage, where a bit line is a control line that applies a drain voltage to one or more drain terminals of one or more bias elements.

In particular example configurations, a bit line biases drain terminals by applying its bit line voltage to one or more drain ends or sides of one or more channel element groups and/or associated channels, and/or by biasing one or more drain ends or sides of one or more channel element groups and/or associated channels with a bit line voltage. In this context, a bit line voltage may alternatively be referred to as a drain-side channel voltage (or just drain-side voltage). Herein, the terms bit line voltage, drain voltage, drain-side voltage, and drain-side channel voltage are used interchangeably, at least as those voltages pertain to NAND technology, unless expressly described otherwise. Channel element groups, channels, and their drain ends are described in further detail below.

A source line (at least for NAND technology) is a control line that applies a source line voltage to one or more source terminals (or just source) of one or more bias elements, and/or that biases one or more source terminals of one or more bias elements with a source line voltage. In this context, the source line voltage may alternatively be referred to as a source voltage, where a source line is a control line that applies a source voltage to one or more source terminals of one or more bias elements. In particular example configurations, a source line biases source terminals by applying its source line voltage to one or more source ends or sides of one or more channel element groups and/or associated channels, and/or by biasing one or more source ends or sides of one or more channel element groups and/or associated channels with a source line voltage. In this context, a source line voltage may alternatively be referred to as a source-side channel voltage or (or just source-side voltage). Herein, the terms source line voltage, source voltage, source-side voltage, and source-side channel voltage are used interchangeably, at least as those voltages pertain to NAND technology, unless expressly described otherwise. Additionally, or alternatively, the source line of a block may alternatively be referred to as a cell source line CELSRC. Channel element groups, channels, and their source ends are described in further detail below.

In at least some example configurations, control gate lines of a block may be further organized, arranged, characterized, divided, or configured into a plurality of different control gate types (or sub-types). In particular, the control gate lines may be further arranged into the types of bias elements that they bias, and include word lines, dummy word lines, drain select gate lines (referred to as SGD lines), and source select gate lines (referred to as SGS lines).

A word line is a control gate line that applies a word line voltage to one or more control gates of one or more memory cells, and/or that biases one or more control gates of one or more memory cells with a word line voltage. A dummy word line is a control gate line that applies a dummy word line voltage to one or more control gates of one or more dummy cells, and/or that biases one or more control gates of one or more dummy cells with a dummy word line voltage. A drain select gate line (referred to as an SGD line) is a control gate line that applies a drain select gate voltage (referred to as a SGD line voltage) to one or more control gates of one or more SGD transistors, and/or that biases one or more control gates of one or more SGD transistors with an SGD line voltage. A source select gate line (referred to as a SGS line) is a control gate line that applies a source select gate voltage (referred to as a SGS line voltage) to one or more control gates of one or more SGS transistors, and/or that biases one or more control gates of one or more SGS transistors with an SGS line voltage.

For some example configurations of a three-dimensional block, at least one type of control line is implemented or formed as a plurality of layers. For example, in at least some 3-D NAND configurations, the control gate lines of a block are implemented or formed as layers. In general, a layer, otherwise referred to as a sheet or a plate, is a generally planar structure extending in the x-y directions perpendicular to the z-direction. A layer has opposing planar surfaces facing in opposite directions. One of the planar surfaces is a top surface that faces in the z-direction away from the substrate 402, and the other planar surface is a bottom surface that faces in the z-direction toward the substrate 402.

Herein, the terms "line" and "layer," at least as they are used to refer to control lines—except SGD lines as described in further detail below—are used interchangeably or as alternatives to each other. For example, the terms "control gate line" and "control gate layer" are used interchangeably; the terms "word line" and "word line layer" are used interchangeably; the terms "dummy word line" and "dummy word line layer" are used interchangeably; and the terms "source select gate line" (or SGS line) and "source select gate layer" (or SGS layer) are used interchangeably.

In addition, for at least for some example configurations of 3-D NAND technology, a three-dimensional block includes a stack. In general, a stack is a plurality or a collection of layers disposed on top of one another. For 3-D NAND, a stack of a block includes a plurality of control gate layers and a plurality of dielectric layers. A dielectric layer, at least when implemented with control gate layers of a stack, is a layer that electrically isolates one control gate layer from another control gate layer. In the stack, the control gate layers and the dielectric layers are arranged in an alternating manner, in that as the stack extends in the z-direction away from the substrate, the layers consecutively alternate between control gate layers and dielectric layers. In this context, a stack of a three-dimensional block is a collection of alternatingly disposed control gate layers and dielectric layers.

A stack of a three-dimensional block includes outer surfaces and edges as defined by the side surfaces and edges of the layers, as well as a top surface of a top-most layer of the stack and a bottom surface of a bottom-most layer of the stack. The outer surfaces and edges of the stack, in turn, define an outer boundary of the stack. The bias elements of the three-dimensional block are three-dimensionally arranged within the outer boundary. In this context, the bias elements of the three-dimensional block are referred to as being disposed in or within the stack.

In addition, at least for some example configurations, the bias elements of a three-dimensional block are disposed coplanar (in the x-y direction) with control gate layers. In particular, the bias elements are coplanar with the control gate layers by which they are configured to be biased. Accordingly, memory cells configured to be biased by a particular word line layer are disposed coplanar with the particular word line layer; SGD transistors configured to be biased by a particular SGD layer are disposed coplanar with the particular SGD layer; SGS transistors configured to be biased by a particular SGS layer are disposed coplanar with the particular SGS layer; and dummy cells configured to by biased by a particular dummy word line layer are disposed coplanar with the particular dummy word line layer.

A bias element that is coplanar with and/or configured to be biased by a given control gate layer may be referred to as being disposed in, located in, and/or coupled to the given control gate layer. For example, a memory cell coplanar with and/or configured to be biased by a given word line may be referred to as being disposed in, located in, and/or coupled to the given word line layer.

In addition, at least for some example configurations of 3-D NAND technology, a three-dimensional block includes a plurality of channels. A channel is an elongate structure that extends in the z-direction through a stack of a block, around or about which bias elements of the block are formed or disposed. A bias element that is disposed or formed around or about a channel may at least partially, and in some configurations completely, encompass or surround the channel.

In addition, at least for some example configurations of 3-D NAND technology, bias elements of a block are biased by way of channels. Otherwise stated, a channel is structure of a block by which bias elements are biased. In particular, drain terminals and source terminals of bias elements are biased by way of channels. A bias element that has its source and drain terminals biased by a given channel is coupled to that given channel.

Each channel includes a respective drain end (or drain side) and a respective source end (or source side). A channel extends through a stack in the z-direction toward the substrate from its drain end to its source end. Bit lines of a block are electrically connected or coupled the drain ends of the channels, and the source line of a block is electrically connected or coupled to the source ends of the channels. In a block, a bit line applies a bit line voltage (or drain voltage or drain-side voltage or drain-side channel voltage) to the one or more drain ends of one or more channels to which it is coupled. The source line applies a source line voltage (or source voltage or source-side voltage or source-side channel voltage) to the source ends of the channels to which it is coupled.

Additionally, or alternatively, as used herein, a channel element group is a plurality or a collection of bias elements that are formed or disposed around or about the same channel. A given channel and a given channel element group that includes the bias elements disposed or formed around or about the given channel are referred to as being coupled to and/or associated with each other. In addition, bias elements that are part of the same channel element group are referred as being coupled to each other.

For at least some example configurations, the bias elements of a channel element group include a plurality of memory cells, at least one SGD transistor, and at least one SGS transistor. In particular, example configurations, a channel element group may further include one or more dummy cells.

The channel element groups extend in the z-direction about their associated channels. Similar to the channels, the channel element groups each include respective drain ends (or drain sides) and source ends (or source sides). A channel extends in the z-direction toward the substrate from its drain end to its source end.

Drain ends of channel element groups are electrically coupled to drain ends of their associated channels. Accordingly, the bit lines are electrically connected or coupled to drain ends of channels and associated channel elements groups. A bit line is configured to apply a bit line voltage (or a drain voltage, a drain-side channel voltage, or a drain-side voltage) to drain ends of channels and associated channel element groups to which the bit line is coupled. Otherwise stated, a bit line voltage (or a drain voltage, a drain-side channel voltage, or a drain-side voltage) is a voltage that a bit line generates and that it applies to a drain end (or drain side) of a channel and/or a drain end (or drain side) of a channel element group to which it is electrically connected or coupled. During at least some memory operations, a bit line may bias one or more drain terminals of one or more bias elements by applying a bit line voltage (or a drain voltage, a drain-side channel voltage, or a drain-side voltage) to one or more drain ends of one or more channels and/or to one or more drain ends of one or more channel element groups to which it the bit line is electrically connected or coupled. Otherwise stated, during memory operations, a bit line biases one or more drain terminals of one or more bias elements with a bit line voltage (or a drain voltage, a drain-side channel voltage, or a drain-side voltage) by way of the drain ends of one or more channels and/or the drain ends of one or more channel element groups to which the bit line is coupled.

Similarly, source ends of channel element groups are electrically coupled to source ends of their associated channels. Accordingly, the source line is electrically connected or coupled to source ends of channels and associated channel elements groups. The source line is configured to apply a source line voltage (or a source voltage, a source-side channel voltage, or a source-side voltage) to source ends of channels and associated channel element groups to which the source line is coupled. Otherwise stated, a source line voltage (or a source voltage, a source-side channel voltage, or a source-side voltage) is a voltage that a source line generates and that it applies to a source end (or source side) of a channel and/or a source end (or source side) of a channel element group to which the source line is electrically connected or coupled. During at least some memory operations, a source line may bias one or more source terminals of one or more bias elements by applying a source line voltage (or a source voltage, a source-side channel voltage, or a source-side voltage) to one or more source ends of one or more channels and/or to one or more source ends of one or more channel element groups to which it the source line is electrically connected or coupled. Otherwise stated, during memory operations, a source line biases one or more source terminals of one or more bias elements with a source line voltage (or a source voltage, a source-side channel voltage, or a source-side voltage) by way of the source ends of one or more channels and/or the source ends of one or more channel element groups to which the source line is coupled.

In addition, bias elements of a channel element group extend in the z-direction around or about the same channel. Each bias element of the channel element group is disposed coplanar with one of the plurality of control gate layers of the block. In this regard, each control gate layer of the block is configured to bias a control gate of a respective one of the plurality of bias elements of the channel element group.

In addition, for at least some example configurations, the channel element groups of a block may have the same number of bias elements, the same combination of bias element types, and the same number of bias elements of each bias element type. Additionally, or alternatively, a bias element order in which the bias elements of their respective bias element types extend in the z-direction away from the substrate is the same among the channel element groups of a block. At least for some example configurations of 3-D NAND technology, the bias element order of the bias elements of a channel element group, starting closest to the substrate and moving away from the substrate in the z-direction, includes one or more SGS transistors followed by one or more source-side dummy cells, followed by a plurality of memory cells, followed by one or more drain-side dummy cells, and followed by one or more SGD transistors. Other bias element orders may be possible.

A control gate layer order of the control gate layers and their respective types may match or correspond to the bias element order of a block. Accordingly, at least for some example configurations of 3-D NAND technology, a control gate layer order of a plurality of control gate layers of a block, starting closest to the substrate and moving away from the substrate in the z-direction, includes one or more SGS layers, followed by one or more source-side dummy word line layers, followed by a plurality of word line layers, followed by one or more drain-side dummy word line layers, and followed by one or more SGD layers.

Figure 4B:
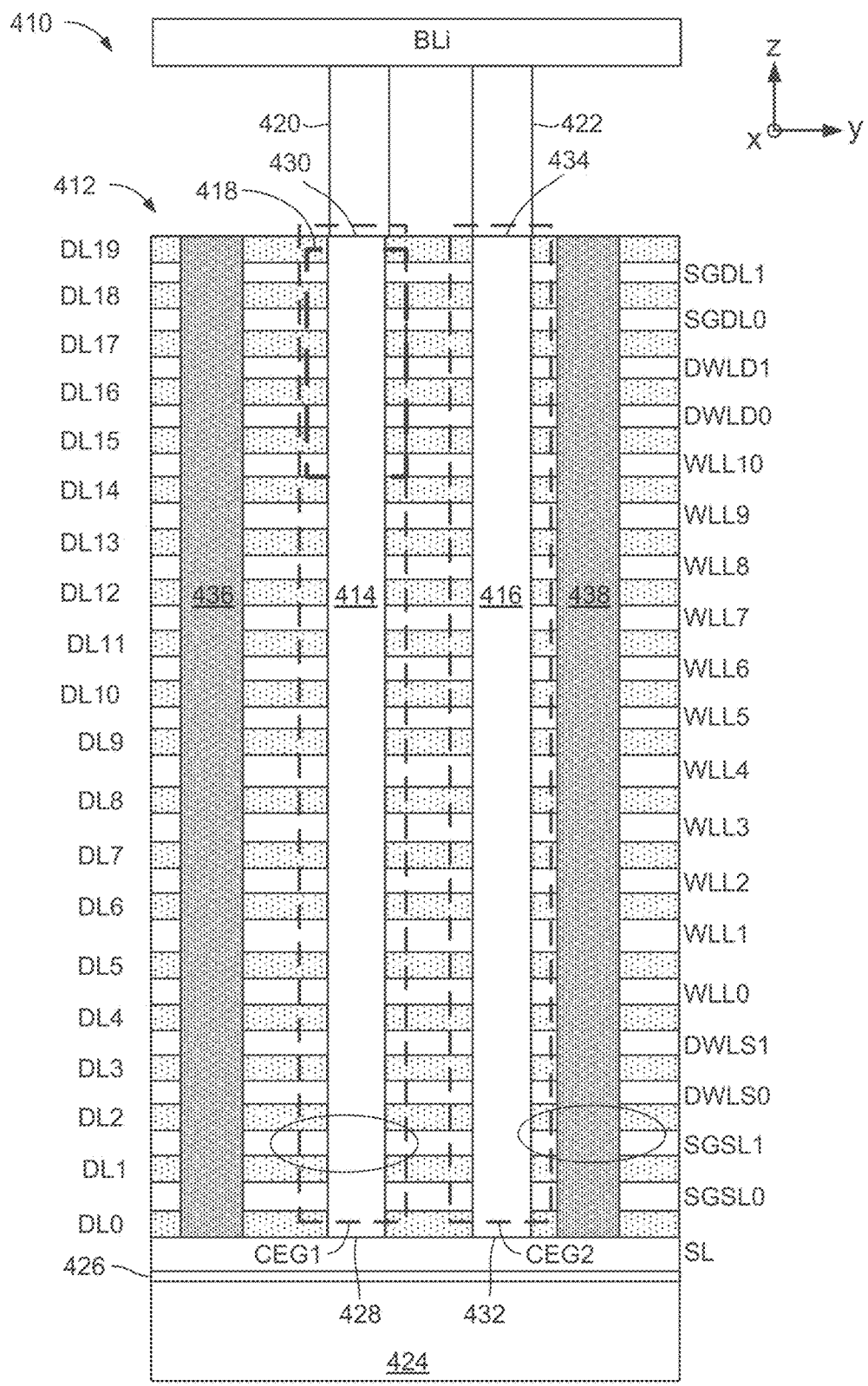
FIG. 4B generally illustrates a cross-sectional view of a portion of one of the blocks of FIG. 4A.

In further detail, FIG. 4B generally illustrates a cross-sectional view of a portion of a block 410, which may be representative of one of the blocks 400 of FIG. 4A. The block 410 includes a stack 412 of alternating control gate layers and dielectric layers (DL). In addition, the portion generally illustrated in FIG. 4B includes two channels (or memory holes) extending through the layers, including a first channel 414 and a second channel 416. Bias elements forming two memory channel element groups around the two channels 414, 416 are identified by dotted boxes in FIG. 4B. In particular, bias elements forming a first channel element group CEG1 around the first channel 414 are identified by a dotted box labeled CEG1, and bias elements forming a second channel element group CEG2 around the second memory hole 416 are identified by a dotted box labeled CEG2. Further details of bias elements and example materials to form the elements and the channels are described in further detail below with respect to FIG. 4C with reference to a particular region 418 of the first channel element group CEG1 and associated first channel 414.

For purposes of illustration, in FIG. 4B, the first and second channel element groups CEG1, CEG2 formed around the first and second channels 414, 416 are both electrically connected to an ith bit line BLi. In actual implementation, a block may include hundreds or thousands of bit lines. An arrangement of channels and associated channel element groups of a block may determine which channels and channel element groups are electrically connected to which bit lines. Among the plurality of channels and channel element groups of a block, certain combinations of channels and associated channel element groups are electrically connected to the same bit line as each other, while certain other combinations of channels and associated channel element groups are electrically connected to different bit lines from each other.

In addition, a given channel element group may be electrically connected to a given bit line by way of its associated channel and a conductive via electrically connecting the associated channel with the bit line. For example, in FIG. 4B, the first channel element group CEG1 is electrically connected to the ith bit line BLi by way of the first channel 414 and a conductive via 420 that electrically connects the first channel 414 with the ith bit line BLi. The second channel element group CEG2 is electrically connected to the ith bit line BLi by way of the second channel 416 and a conductive via 422 that electrically connects the second channel 416 with the ith bit line BLi. Other ways of electrically connecting bit lines with channel element groups may be possible.

The block 410 may further include or be disposed on a substrate 424. An insulating film 426 may be formed on the substrate 424, and a source line SL may be formed or disposed on a bottom-most layer of the stack 412.

In addition, in the example configuration illustrated in FIG. 4B, each channel 414, 416 includes a source end connected to the source line SL, and a drain end connected to its associated conductive via. In FIG. 4B, the first channel 414 includes a source end 428 connected to the source line SL, and a drain end 430 connected to the conductive via 420. Similarly, the second channel 416 includes a source end 432 connected to the source line SL, and a drain end 434 connected to the conductive via 422.

In addition, at least some example configurations, the block 410 may further include vertical interconnects (e.g., metal-filled slits) extending through the stack 412 that connect the source line SL to a conductive line above the stack 412, such as a conductive line in one of the metal layers in the upper region 408 (FIG. 4A). For purposes of illustration, FIG. 4B generally illustrates two interconnects 436, 438 extending through the stack 412.

In addition, in the example configuration in FIG. 4B, for purposes of illustration, each of the channel element groups include two SGS transistors, two source-side dummy cells, eleven memory cells, two drain-side dummy cells, and two SGD transistors. Accordingly, the control gate layers of the stack 412 include: two SGS layers, including a first SGS layer SGSL0 and a second SGS layer SGSL1; two source-side dummy word line layers, including a first source-side dummy word line layer DWLS0 and a second source-side dummy word line layer DWLS1; eleven word line layers extending from a first word line layer WLL0 to an eleventh word line layer WLL10; two drain-side dummy word line layers, including a first drain-side dummy word line layer DWLD0 and a second drain-side dummy word line layer DWLD1; and two SGD layers, including a first SGD layer SGSL0 and a second SGD layer SGDL1. The stack further includes twenty dielectric layers, extending from a first dielectric layer DL0 to a twentieth dielectric layer DL19, alternatingly disposed between the control gate layers.

The numbers of bias elements and their respective bias element types used for the channel element groups and the number of corresponding control gate layers in the example configuration of the block 410 in FIG. 4B are non-limiting and merely exemplary for purposes of illustration. Other numbers of bias elements for any of the bias element types, or other configurations that do not include bias elements of certain bias elements types or that include one or more bias elements of bias element types other than those illustrated in FIG. 4B, may be possible.

Figure 4C:
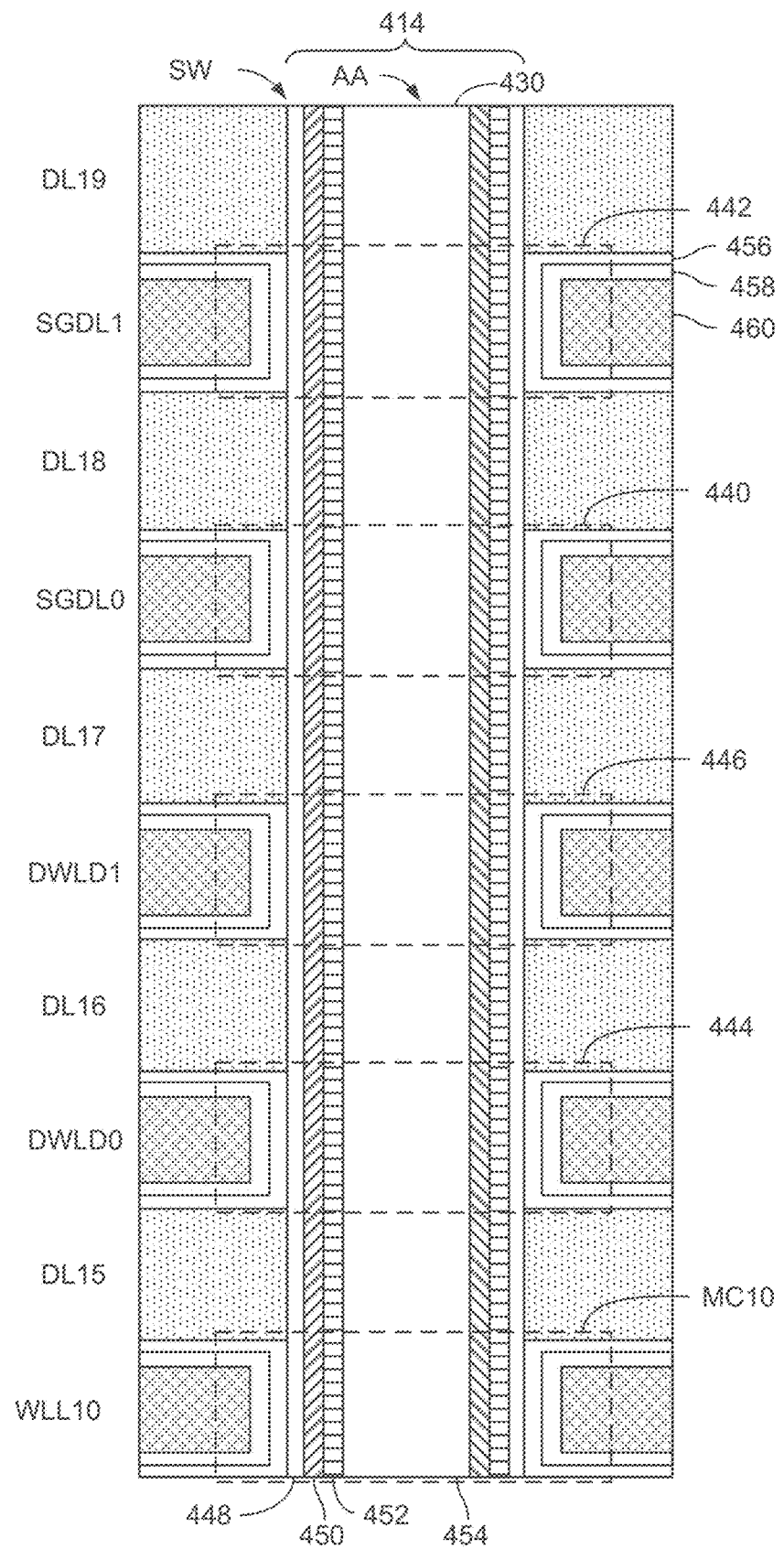
FIG. 4C generally illustrates a close-up view of a region of the cross-section of FIG. 4B.

FIG. 4C is a close-up view of the region 418 of the block 410 of FIG. 4B. The materials forming the bias elements are formed at different levels of the stack 412 at the intersection of respective control gate layers and respective channels. In the example configuration of the block 410, as depicted in the close-up view of FIG. 4C, a first SGD transistor 440 and a second SGD transistor 442 are disposed below the drain end 430 of the first channel 414, and above first and second drain-side dummy cells 444, 446 and an eleventh memory cell MC10.

Physically or structurally, a channel includes a memory hole extending in the z-direction defines by a sidewall (SW). A channel further includes one or more layers of materials disposed in the memory hole and/or on the sidewall, such as by using atomic layer deposition as an example. In some example configurations, as described with respect to the first channel 414, the layers of materials of a channel (which may be referred to as a column or a pillar of materials) may include a charge-trapping layer or film 448 such as silicon nitride, a tunneling layer 450, a polysilicon body or channel 452, and a dielectric core 454. In addition, in some example configurations, such as the one illustrated in FIG. 4C, the materials making up each of the bias elements may include a blocking oxide/block high-k material 456, a barrier metal 458, and a conductive metal 460 (e.g. Tungsten) that forms the control gates of the transistors. The materials forming the bias elements may be disposed in the same level or in the same plane as the respective control gate layers. Other configurations may use materials deposited along the sidewall (SW) and/or for the bias elements other than those illustrated and described with reference to FIG. 4C.

Figure 4D:
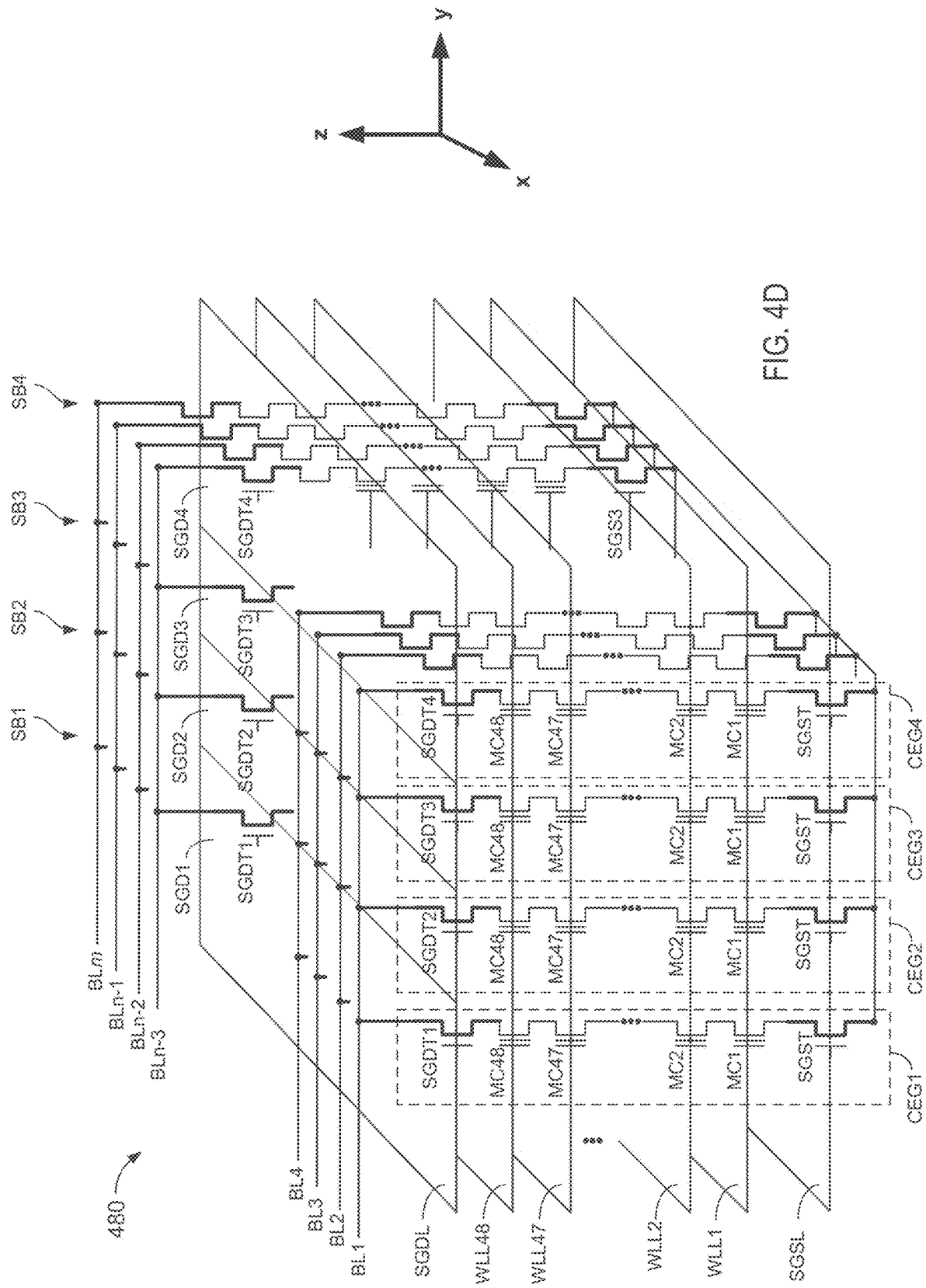
FIG. 4D generally illustrates a circuit schematic diagram of a block of memory cells three-dimensionally arranged into a plurality of NAND strings.

FIG. 4D generally illustrates a circuit schematic diagram of an example configuration of a three-dimensional block 480, which may be representative of at least a portion of one of the blocks 400 of FIG. 4A and/or have the physical construction or structure as depicted in FIGS. 4B, 4C. In FIG. 4D, each bias element is represented or depicted as a transistor. In addition, memory cells are labeled MC, SGD transistors are labeled SGDT, and SGS transistors are labeled SGST. In the example block 480, each channel element group includes 50 cells, including 48 memory cells, extending from a first memory cell MC1 to a 48th memory cell MC48, one SGD transistor SGDT, and one SGS transistor SGST. Other channel element group configurations are possible, including those that include one or more source-side dummy cells, one or more drain-side dummy cells, more than one SGD transistor, and/or more than one SGS transistor, as previously described.

In accordance with the channel element group configuration in FIG. 4B, the block 480 includes 50 control gate layers, including 48 word line layers extending from a first word line layer WLL1 to a 48th word line layer WLL48, a SGD layer SGDL, and a SGS layer SGSL. As previously described, the ith memory cells MCi in each channel element group are disposed in and configured to have their respective control gates biased by the ith word line layer WLLi of the control gate layers. As examples, first memory cells MC1 of the channel element groups CEG are disposed in and configured to have their control gates biased by the first word line layer WLL1, the second memory cells MC2 are disposed in and configured to have their control gates biased by the second word line layer WLL2, and the 48th memory cells MC48 of the channel element groups CEG are disposed in and configured to have their control gates biased by the 48th word line layer WLL48. In addition, the SGD transistors of the channel element groups are disposed in and configured to have their respective control gates biased by the SGD layer SGDL, and the SGS transistors of the channel element groups are disposed in and configured to have their respective control gates biased by the SGS layer SGSL.

As depicted in FIG. 4D, the channel element groups CEG and their associated channels are two-dimensionally arranged in the x and y directions in the block 480, and electrically connected to an m-number of bit lines. In particular example configurations, the channel element groups CEG and their associated channels are two-dimensionally arranged in accordance with a channel arrangement that depends on a P-number of channel element groups and their associated channels that are connected to a single bit line. Otherwise stated, each bit line BL is configured to electrically connect to, apply a respective bit line voltage to, and/or bias with a respective bit line (channel) voltage, a unique set of a P-number of channel element groups and their associated channels.

In the example configuration of FIG. 4D, each bit line BL is configured to electrically connected to four channel element groups (i.e., P=4). Accordingly, FIG. 4D generally illustrates the first bit line BL1 electrically connected to each of a first channel element group CEG1, a second channel element group CEG2, a third channel element group CEG3, and a fourth channel element group CEG4. Each of the other two through mth bit lines BL2 to BLm are also electrically connected to a respective set of four channel element groups and their respective channels. Numbers for P other than four may be possible for various other configurations.

In some example configurations, an SGD layer may be separated or divided into a plurality of different drain select gate (SGD) sub-layers that are electrically isolated or disconnected from each other. For example, an SGD layer may be etched to remove portions of the metal forming the SGD layer in order to form a plurality of electrically isolated or disconnected SGD sub-layers.

Different SGD sub-layers of the same SGD layer may be independently and/or individually biased and/or supplied with a different one of a plurality of SGD line voltages. In turn, for a given plurality of SGD transistors disposed in the same SGD layer, each SGD sub-layer of the same SGD layer may be configured to bias the control gates of those SGD transistors disposed in its SGD sub-layer, but not the SGD transistors disposed in the other SGD sub-layers. In this way, the plurality of SGD sub-layers may be configured to independently or individually bias the different SGD transistors within their respective SGD sub-layers with a respective one of a plurality of SGD line voltages.

In addition, for example configurations that include multiple SGD layers, each SGD layer may include multiple SGD sub-layers. The number of SGD sub-layers in each SGD layer may be the same. In addition, certain combinations of SGD-sub-layers in different SGD layers may be electrically coupled and/or supplied with the same SGD line voltage such that SGD transistors of the same channel element group have their control gates biased with the same SGD line voltage. SGD sub-layers that bias SGD transistors with the same SGD line voltage form part of the same SGD line.

As used herein, an SGD line is a conductive structure of a block that biases control gates of SGD transistors with a common or the same SGD line voltage. Accordingly, as used specifically herein for SGD layers and SGD lines, the terms "line" and "layer" are not used interchangeably. Instead, an SGD line is a single SGD sub-layer, or a collection of SGD sub-layers each part of a different SGD layer. In particular, for 3-D block configurations that include a single SGD layer, each SGD sub-layer of the SGD layer forms an entire SGD line. For 3-D block configurations that include multiple SGD layers, each SGD sub-layer forms a part of an SGD line with one or more other SGD sub-layers from one or more other SGD layers.

In addition, different SGD lines are configured to independently or separately bias different sets or groups of SGD transistors of a block with different SGD line voltages. An SGD line is configured to bias the control gates of those SGD transistors to which it is coupled or electrically connected, and not bias the control gates of those SGD transistors from which it is uncoupled or electrically disconnected. Accordingly, the SGD transistors SGDT of a block are arranged or formed into a plurality of SGDT groups. SGD transistors that are part of the same SGDT group are coupled to the same SGD line and configured to be biased by the same SGD line voltage. SGD transistors that are part of different SGDT groups are coupled to different SGD lines and configured to be biased by different SGD line voltages.

In addition, for at least some example configurations of a 3-D block, the number of SGD lines is equal to the P-number of channel element groups and associated channels that are connected to the same bit line. For example, with reference to FIG. 4D, the block 480 includes four SGD lines corresponding to the four channel element groups connected to a single bit line, including a first SGD line SGD1, a second SGD line SGD2, a third SGD line SGD3, and a fourth SGD line SGD4. Otherwise stated, the SGD layer SGDL includes four SGD lines SGD1, SGD2, SGD3, and SGD4.

In addition, the channel element groups may be arranged so that for a given set of channel element groups connected to the same bit line, each channel element group of the set has its SGD transistor SGDT coupled to a different one of the SGD lines. For example, in the block 480 of FIG. 4D, the set of four channel element groups CEG1, CEG2, CEG3, CEG4 connected to the first bit line BL1 have their respective SGD transistors connected to a different one the SGD lines SGD1, SGD2, SGD3, SGD4. In particular, the first channel element group CEG1 includes an SGD transistor SGDT1 coupled to and configured to have its control gate biased by the first SGD line SGD1, the second channel element group CEG2 includes an SGD transistor SGDT2 coupled to and configured to have its control gate biased by the second SGD line SGD2, the third channel element group CEG3 includes an SGD transistor SGDT3 coupled to and configured to have its control gate biased by the third SGD line SGD3, and the fourth channel element group CEG4 includes an SGD transistor SGDT4 coupled to and configured to have its control gate biased by the fourth SGD line SGD4.

A 3-D block may be arranged, organized, or divided into sub-blocks across the m-number of word lines based on the different SGD lines. As used herein, a sub-block is a portion of a block that has channel element groups with SGD transistors configured to be biased by the same SGD line and/or with the same SGD line voltage. A sub-block may span, such as in the x-direction, across the m-number of word lines of a block. In addition, channel element groups with SGD transistors configured to be biased by different SGD transistors and/or with different SGD line voltages are part of different sub-blocks.

The number of sub-blocks of a block may be equal to the number of SGD lines. For example, the example block 480 of FIG. 4D includes four sub-blocks (SB) equal to the number of SGD lines, including a first sub-block SB1, a second sub-block SB2, a third sub-block SB3, and a fourth sub-block SB4. The first sub-block SB1 includes those channel element groups with SGD transistors SGD1 coupled to the first SGD line SGD1 and configured to be biased with a first SGD line voltage, the second sub-block SB2 includes those channel element groups with SGD cells SGD2 coupled to the second SGD line and configured to be biased with a second SGD line voltage, the third sub-block SB3 includes those channel element groups with SGD cells SGD3 coupled to the third SGD line and configured to be biased with a third SGD line voltage, and the fourth sub-block SB4 includes those channel element groups with SGD cells SGD4 coupled to the fourth SGD line and configured to be biased with a fourth SGD line voltage.

In addition, a block of memory cells (i.e., memory cells that are part of the same block), may be arranged, organized, separated, and/or labeled on a sub-block level, or on both a sub-block level and a word line level. A plurality of memory cells MC that are part of the same sub-block is referred to as a sub-block of memory cells. Otherwise stated, a sub-block of memory cells are memory cells of channel element groups having SGD cells coupled to the same SGD line and/or configured to be biased with the same SGD line voltage.

In addition, a plurality of memory cells that are part of the same sub-block, and that are also disposed in the same word line layer and/or that are configured to have their control gates biased by the same word line and/or with the same word line voltage are referred to as a word line cell group or a string of memory cells. Otherwise stated, a word line cell group (or string) of memory cells is a plurality or a collection of memory cells coupled to the same word line layer, and that are part of channel element groups configured to be biased with the same SGD line voltage.

A single word line layer may include a plurality of word line cell groups, such that the memory cells disposed in a single word line layer are organized, arranged, or disposed into a plurality of word line cell groups (or strings). Memory cells coupled to the same word line layer but that are part of channel element groups having SGD transistors coupled to different SGD lines are part of different word line cell groups. In particular example configurations, the number of word line cell groups coupled to a single word line layer is equal to the number of SGD lines of a block. In addition, the number of memory cells of a single word line cell group may be equal to the m-number of bit lines BL1 to BLm, such that each memory cell of a word line cell group is electrically connected to a different one of the m-number of bit lines BL1 to BLm.

Additionally, or alternatively, the memory cells of a block or of the memory cell structure 142 generally, are configured to store data as bits or binary digits, with each bit having either a logic 0 or a logic 1 binary value. A single memory cell may be configured to store either a single bit or a plurality of bits. A bit or bits that a single memory cell stores is referred to as a data value. Otherwise stated, a data value is an n-bit binary value that a single memory cell stores, where n is the number of bits of the binary value, and where the number n is one or more. The number of possible data values that a single memory cell can store depends on the n-number of bits it is configured to store. In particular, the number of possible data values a single memory cell can store is $2^n$.

Memory cells may be referred to as single-level cells or multi-level cells depending on the number of bits they are configured to store. A single-level cell, referred to as a SLC cell (or just SLC), is a memory cell configured to store a single or one bit of data. A multi-level cell, referred to as a MLC cell (or just MLC), is a memory cell configured to store multiple (i.e., two or more) bits of data. Example numbers of bits that an MLC cell can store include 2, 3, or 4, although MLC cells that store more than 4 bits may be possible.

In general, certain collections of memory cells are configured to store the same number of bits. For example, memory cells that are part of the same word line cell group, part of the same block, or part of the same memory cell structure 142, are configured to store the same number of bits. In this context, a given collection of memory cells (e.g., memory cells of the same word line cell group, the same block, the same memory cell structure, etc.) stores data on a bits-per-cell basis. Each memory cell of the given collection stores the same number of bits-per-cell.

In addition, a memory cell structure 142, including blocks and word line cell groups of the memory cell structure 142, may store data as pages. Herein, a page is a single unit of data that a single word line cell group of memory cells stores. The number of pages that a single word line cell group stores depends on the number of bits-per-cell that the memory cells of the single word line cell group are configured to store. As examples, a word line cell group of SLC cells is configured to store a single or one page of data; a word line cell group of MLC cells configured to store two-bits-per-cell is configured to store two pages of data;

and a word line cell group of MLC cells configured to store three-bits-per-cell is configured to store three pages of data.

In addition, a memory cell structure 142 may store data according to one or more storage schemes. As used herein, a storage scheme is a general plan including a predefined set of actions and a predefined set of parameters that a memory system implements to store data. A given storage scheme for a particular collection of memory cells may identify or define the number of bits-per-cell that the memory cells of the particular collection are configured to store. The components of the memory system, including the circuit components on a given memory die, are configured to perform memory operations on the particular collection in accordance with the given storage scheme in order to program data into and/or read data from the particular collection of memory cells.

Memory cells of different memory technologies may store data in accordance with different storages schemes. In addition, memory cells of the same memory technology may store data in accordance with different storage schemes. For example, memory cells of the same memory technology but located in different memory systems, or in the same memory system but in different memory dies, or in different blocks or planes of the same memory die, or even different word line layers or different word line cell groups of the same block, may store data in accordance with different storage schemes, at least with respect to the number of bits-per-cell the different memory cells are configured to store.

At least for NAND memory technology, the NAND memory cells may be configured to store data in accordance with one of multiple different storage schemes, with each storage scheme associated or identifying a different number of bits-per-cell. In at least some example configurations, some NAND memory cells may store data according to one storage scheme while other NAND memory cells store data according to a different storage scheme. Accordingly, two different collections of NAND memory cells located in different memory systems, or in the same memory system but in different dies, planes, blocks, word line layers, or word line cell groups, may store different numbers of bits-per-cell according to different storage schemes. To illustrate, one collection of NAND memory cells may be configured as SLC cells and another collection of NAND memory cells may be configured as MLC cells.

In addition, the same memory cell (or the same collection of memory cells) may be configured to store different numbers of bits-per-cell according to different storage schemes at different times. To illustrate, in one example, a memory cell may be configured as an SLC cell at one point in time, and then reconfigured as an MLC cell at a later point in time. As another example, a memory cell may be configured as an MLC cell at one point in time, and then reconfigured as an SLC cell at a later point in time. As another example, a memory cell may be configured as an MLC cell storing a first number of bits-per-cell at one point in time, and then reconfigured as an MLC cell storing a second number of bits-per-cell at a later point in time, where the first and second numbers are different from each other, with the first number being either less than or greater than the second number.

In addition, a memory cell stores data by having an associated storage parameter (alternatively or otherwise referred to as a characteristic, property, or feature) set to a level, value, magnitude, or state. The associated parameter is adjustable or variable, and can be controlled by biasing the control lines coupled to the memory cells at certain levels, at certain times, during certain memory operations, and according to certain storage schemes. Within one storage scheme defining a set of data values, a memory cell can store data at a certain one of the data values by having its storage parameter set to a level, value, magnitude, or state, or within a predetermined range of levels, values, magnitudes, or states. The level, value, magnitude, or state that the memory cell is at or set to corresponds to the data value of the set that the memory cell is storing. In addition, the memory cell can be configured to store a different value, or to change the data value of the data it is storing from one data value to another data value, by changing or adjusting the storage parameter to a different level, value, magnitude, or state.

The storage parameter that a memory cell has to store data depends on the memory technology, and can vary across different memory technologies. For NAND technology, the storage parameter is threshold voltage. At least with respect to NAND memory cells, a threshold voltage of a memory cell is a voltage applied to a control gate of the memory cell at which the memory cell becomes conductive. The level (otherwise referred to as the value or magnitude) of the threshold voltage depends on or is proportional to the amount of electrical charge that the memory cell is storing or trapping. The more charge that a memory cell is storing, the higher its threshold voltage, and the less charge that a memory cell is storing, the lower its threshold voltage. Accordingly, the data value that the memory cell is storing is set by setting the threshold voltage of the memory cell to a certain level, and the data value is adjusted or changed by changing the threshold voltage to a different level or within a different range of levels.

In addition, for NAND technology, the memory cells store data by being configured in memory states. As used herein, a memory state is an identifier that identifies a data value of data that a memory cell is storing, can store, or is intended to store. A storage scheme identifies or defines an associated plurality or set of memory states at which a memory cell can be configured. Each memory state identifies, corresponds to, and/or is associated with one of the plurality of data values identified or defined by the storage scheme. Accordingly, a memory cell configured in a given memory state is storing a data value that corresponds to the given memory state. A memory cell can store a different data value by being configured into a different memory state.

For a given storage scheme, the memory states include an erased state and one or more program states. An erased state is a memory state in which a memory cell is configured when erased. For at least some example configurations, the erased state is the memory state that all of a collection of memory cells are in at the start of a program operation to program at least some of the memory cells of the collection. A program state is a memory state that a memory cell is in upon being subjected to a program operation. At a given point in time, a memory cell may be in the erased state or one of the program states.

In addition, for a given storage scheme, each memory state has, corresponds to, or is associated with an associated range of threshold voltage levels, with each range being bounded by an upper threshold voltage level and a lower threshold voltage level. Otherwise stated, a given storage scheme may define a plurality of non-overlapping threshold voltage ranges, with each range being associated with or corresponding to a respective one of the plurality of memory states defined or identified by the given storage scheme. In turn, each range has, corresponds to, or is associated with a respective one of the data values. In this way, a storage scheme establishes a one-to-one correspondence between the threshold voltage ranges, the memory states, and the data values. Memory cells are programmed and read according to the one-to-one correspondence. That is, a memory cell configured with a threshold voltage level within a given threshold voltage range is configured in the memory state associated with the given threshold voltage range, and in turn is storing data having a data value that is associated with the given threshold voltage range and the corresponding memory state.

For particular embodiments, the erased state is associated with the lowest threshold voltage range. The program states are associated with consecutively or sequentially higher threshold voltage ranges from the range associated with the erased state.

In addition, the storage schemes may label or name the memory states in any of various ways, including alphabetically, numerically, or alphanumerically, as non-limiting examples. In particular example configurations, the erased state is called the erased state, and the program states are named with letters, numbers, or a combination thereof by associating higher letters in the alphabet or higher numbers with higher threshold voltage ranges. As illustrations, a memory state C is associated with a higher threshold voltage range than a memory state A, and a memory state 8 is associated with a higher threshold voltage range than a memory state 1. Various ways of labeling or naming memory states are possible.

In addition, memory states may be referred to as being higher memory states and lower memory states relative to each other. A first memory state is a higher memory state than a second memory state where the first memory state is associated with a higher threshold voltage range than the threshold voltage range with which the second memory state is associated. In addition, a first memory state is a lower memory state than a second memory state where the first memory state is associated with a lower threshold voltage range than the threshold voltage range with which the second memory state is associated.

In addition, the way in which the data values correspond to the memory states and/or the threshold voltage ranges may vary, and in particular, embodiments, how the data values correspond to or are assigned to the memory states and/or threshold voltage ranges may depend on a particular code scheme, such as the Gray code scheme, for example.

In implementation, a collection of memory cells programmed into the same memory state may have an associated collection of threshold voltage as a result of the programming. The threshold voltages may be represented as a threshold voltage probability distribution, or just threshold distribution of the number of memory cell in the collection as a function of threshold voltage.

A given storage scheme may have a model, reference, ideal, or target threshold voltage distribution, which may be in the form of a continuous probability distribution, such as a Gaussian distribution, for example, for each of the memory states and associated threshold voltage ranges defined by the given storage scheme. A model threshold voltage distribution may represent a model of an ideal threshold voltage distribution for a collection of memory cells programmed into the same memory state to have. The lower and upper tails of the model threshold voltage distributions may align or correspond to the upper and lower threshold voltage levels of the ranges with which each of the model threshold voltage distributions is associated.

Figure 5A:
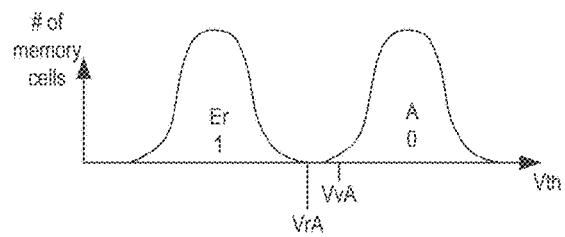
FIG. 5A generally illustrates a plot of threshold voltage distribution curves for memory cells storing one bit of data per cell.
Figure 5B:
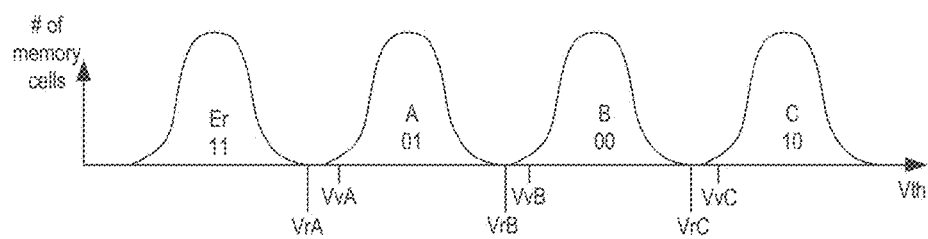
FIG. 5B generally illustrates a plot of threshold voltage distribution curves for memory cells storing two bits of data per cell.
Figure 5C:
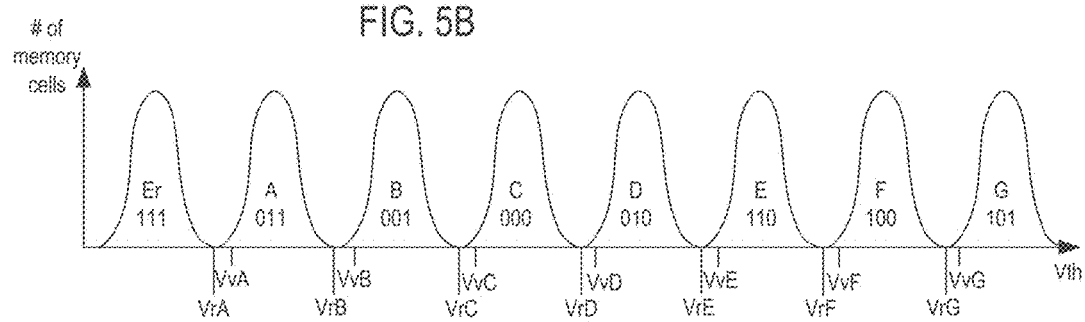
FIG. 5C generally illustrates a plot of threshold voltage distribution curves for memory cells storing three bits of data per cell.
Figure 5D:
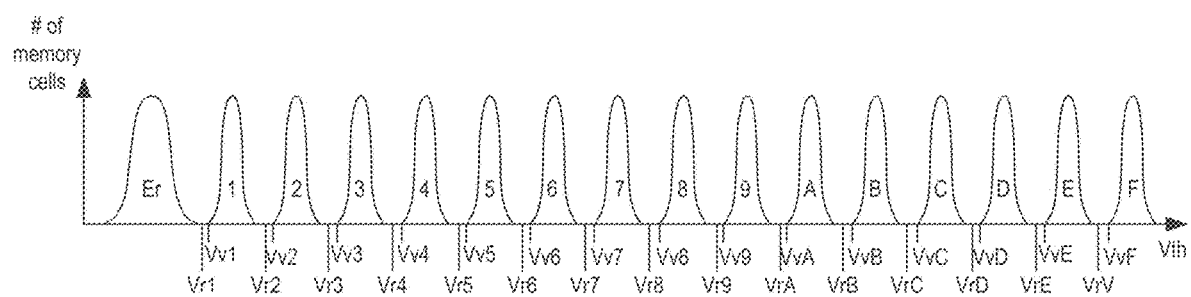
FIG. 5D generally illustrates a plot of threshold voltage distribution curves for memory cells storing four bits of data per cell.

FIGS. 5A-5D are plots of threshold voltage distribution curves for different storage schemes for storing different numbers of bits into memory cells. The threshold voltage distribution curves are plotted for numbers of memory cells as a function of threshold voltage Vth. In addition, FIGS. 5A-5D generally illustrate the memory state, the data value, and the threshold voltage range with which each threshold voltage distribution curve is associated. FIG. 5A generally illustrates threshold voltage distribution curves for an SLC storage scheme for storing one bit of data per memory cell. FIGS. 5B-5D generally illustrate threshold voltage distribution curve for MLC storage schemes. In particular, FIG. 5B generally illustrates threshold voltage distribution curves for an MLC storage scheme for storing two bits of data per memory cell; FIG. 5C generally illustrates threshold voltage distribution curves for an MLC storage scheme for storing three bits of data per memory cell; and FIG. 5D generally illustrates voltage distribution curves for an MLC storage scheme for storing four bits of data per memory cell. Similar threshold voltage distribution curves may be defined or generated for other storage schemes used for storing numbers of bits other than (such as more than) two, three, or four bits-per-cell.

With reference to FIG. 5A, for memory cells configured to store one bit of data, each of the memory cells may be configured in an erase state Er or a program state A. With reference to FIG. 5B, for memory cells configured to store two bits of data, each of the memory cells may be configured in an erase state Er or one of three program states A, B, C. With reference to FIG. 5C, for memory cells configured to store three bits, each of the memory cells may be configured in an erase state Er or one of seven program states A, B, C, D, E, F, G. With reference to FIG. 5D, for memory cells configured to store four bits, each of the memory cell may be configured in an erase state Er or one of fifteen program states 1, 2, 3, 4, 5, 6, 7, 8, 9, A, B, C, D, E, F. As generally illustrated in FIGS. 5A-5D, each voltage distribution curve is associated with the erase state or one of the program states. Additionally, or alternatively, herein, the terms "memory state" and "program state" are used interchangeably. For example, the terms "memory state A" and "program state A" are used interchangeably to refer to the same memory state.

As illustrated in FIGS. 5A-5D, each program state is associated with a respective verify threshold voltage level (or just verify threshold level) Vv and a read voltage threshold level (or just read threshold level) Vr. For example, with respect to the storage schemes of FIGS. 5A-5D, a verify threshold level VvA and a read threshold level VrA are associated with memory state A, verify threshold level VvB and read threshold level VrB are associated with memory state B, and verify threshold level VvC and read threshold level VrC are associated with memory state C. Similar verify and read threshold levels Vv, Vr are associated with other memory states, such as memory states D-G and memory states 1-9, as depicted in FIGS. 5C and 5D.

As generally illustrated in FIGS. 5A-5D, the verify and read threshold levels Vv, Vr specify or are positioned relative to lower bounds or tails of the threshold voltage distribution curves. The verify threshold levels Vv may be used to set levels of selected word line voltages during program operations in order to verify program statuses of the memory cells, and the read threshold levels Vr may be used to set levels of selected word line voltages during read operations in order to read data from the memory cells.

In addition, in FIGS. 5A-5D, the associated memory state and data value is included within or under each of the threshold voltage distribution curves. For example, FIG. 5A generally illustrates an example embodiment where the left threshold voltage distribution curve is associated with the erased state Er and a logic 1 value, and the right threshold voltage distribution curve is associated with memory state A and a logic 0 value. In various embodiments of MLC storage schemes depicted in FIGS. 5B-5D, the data values sequentially change with increasing memory states and threshold voltage ranges. In various embodiments, the data values may change according to a predetermined scheme, such as a Gray code scheme. With reference to FIG. 5B, for some example embodiments of memory cells configured to store two bits per cell, memory cells configured in the erase state Er store data value "11"; memory cells configured in memory state A store data value "01"; memory cells configured in memory state B store data value "00"; and memory cells configured in memory state C store data value "10." Similarly, with reference to FIG. 5C, for some example embodiments of memory cells configured to store three-bits per cell, memory cells configured in the erase state Er store data value "111"; memory cells configured in memory state A store data value "011"; memory cells configured in memory state B store data value "001"; memory cells configured in memory state C store data value "000"; memory cells configured in memory state D store data value "010"; memory cells configured in memory state E store data value "110"; memory cells configured in memory state F store data value "100"; and memory cells configured in memory state G store data value "101." Similar relationships or correspondences between data values, memory states, and threshold voltage ranges can be made for memory cells programmed to store four bits (FIG. 5D), or more than four numbers of bits-per-cell.

Data bits stored in the memory cells may be grouped or organized into pages. In turn, the memory cells themselves may be grouped or organized into pages. For SLC storage schemes, a single page of SLC cells may store a single page of data bits. For MLC storage schemes, a single page of MLC cells may store multiple pages of data bits, with the number of pages equal to the number of bits each memory cell is configured to store. Accordingly, a single page of MLC cells configured to store two bits-per-cell may store two pages of data bits. The two pages are referred to as an upper page and a lower page. In addition, a single page of MLC cells configured to store three bits-per-cell may store three pages of data bits. The three pages are referred to as an upper page, a middle page, and a lower page. Additionally, or alternatively, a single page of MLC cells configured to store four pages of data bits may store four pages of data bits. The four pages are referred to as a higher page, an upper page, a middle page, and a lower page.

Additionally, or alternatively, for MLC storage schemes, each MLC cell may store a bit in one of the multiple pages. Accordingly, an MLC cell configured to store two bits-per-cell stores a first, lower-page bit that is part of the lower page and a second, upper-page bit that is part of the upper page; an MLC cell configured to store three bits-per-cell stores a first, lower-page bit that is part of the lower page, a second, middle-page bit that is part of the middle page; and a third, upper-page bit that is part of the upper page; an MLC cell configured to store four bits-per-cell stores a first, lower page bit that is part of the lower page, a second, middle-page bit that is part of the middle page, a third, upper-page bit that is part of the upper page, and a fourth, higher-page bit that is part of the higher page, and so on.

Additionally, or alternatively, for MLC storage schemes, the bit values of the bits that the MLC cells are configured to store depend on: the number of bits-per-cell that the MLC cells are configured to store, the program states of the MLC cells, and the pages to which the bits belong. To illustrate, with respect to two bits-per-cell storage scheme illustrated in FIG. 5B, the left bit is a lower-page bit and the right bit is an upper page bit. For example, an MLC cell programmed in memory state A stores a lower-page bit having a logic 0 value and an upper-page bit having a logic 1 value. Similarly, with respect to the three bits-per-cell storage scheme illustrated in FIG. 5C, the left bit is a lower-page bit, the middle bit is a middle-page bit, and the right bit is an upper-page bit. For example, an MLC cell programmed in memory state D stores a lower-page bit having a logic 0 value, a middle-page bit having a logic 1 value, and an upper-page bit having a logic 0 value.

Referring back to FIG. 2B, the memory die 104 may further include a read/write circuit 144 that includes a plurality or a p-number of sense blocks (also referred to as sense modules or sense systems) 146. As described in further detail below, the sense blocks 146 are configured to participate in reading data from or programming data into word line cell groups of memory cells in parallel by performing sense operations to sense data values that the memory cells are storing in order to read the data values from the memory cells, or to verify that the memory cells are sufficiently programmed.

The memory die 104 may also include a row address decoder (or just row decoder) 148 and a column address decoder (or just column decoder) 150. The row decoder 148, which may also be referred to as a word line decoder, an x decoder, or an x-wire decoder, may decode a row address (also referred to as a word line address or an x address), and select a particular word line in the memory cell structure 142 corresponding to and/or identified by the decoded row address when reading data from or programming/writing data into to the memory cell structure 142. The column decoder 150, which may also be referred to as a bit line decoder, a y decoder, or a y-wire decoder, may decode a column address (also referred to as a bit line address or a y address), and select a particular bit line or group of bit lines in the memory cell structure 142 corresponding to and/or identified by the column address, when reading data from or programming data to the memory cell structure 142.

In addition, the non-volatile memory die 104 may include a peripheral circuit 152. The peripheral circuit 152 may include a control logic circuit (also referred to as a control logic, an on-chip controller, or an on-die controller) 154, which, at least in some example embodiments, may be implemented as a state machine, that is configured to control on-chip memory operations as well as send status information to the controller 102. The peripheral circuit 152 may also include an on-chip address decoder 156 that provides an address interface between addressing used by the controller 102 and/or a host and the addressing used by the row and column decoders 148, 150. In addition, the peripheral circuit 152 may include volatile memory 158. An example configuration of the volatile memory 158 may include latches, although other configurations are possible.

In addition, the peripheral circuit 152 may include a power control circuit 160 that is configured to generate and supply control line voltages (including voltage pulses) to control lines of the memory cell structure 142. The control line voltages include control gate line voltages supplied to control gate layers, bit line voltages supplied to bit lines, and supply line voltages supplied to supply lines. The control gate line voltages include word line voltages supplied to the word lines, drain select gate line voltages (SGD line voltages) supplied to the SGD lines, and source select gate line voltages (SGS line voltages) supplied to the SGS lines. The power control circuit 160 also be configured to generate and/or supply voltages other than the control lines voltages, including other voltages that may be supplied to the memory cell structure 142, the read/write circuits 144, the sense blocks 146, and/or other circuit components on the memory die 104.

The power control circuit 160 may include any of various circuit topologies or circuit configurations to generate and/or supply the voltages at appropriate levels to perform memory operations, (including read, program/write, sense, and erase operations), such as driver circuits, current sources, charge pumps, reference voltage generators, regulators, and pulse generation circuits, or any of various combinations thereof. Other types of circuits to generate the voltages may be possible. In addition, the power control circuit 160 may communicate with and/or be controlled by the control logic circuit 154, the read/write circuits 144, and/or the sense blocks 146 in order to supply the voltages at appropriate levels and at appropriate times to carry out the memory operations.

During read operations, the power control circuit 160 may bias word lines at read threshold voltage levels Vr in order to read the data values of the data that the memory cells are storing. A threshold voltage level Vr for a given memory state may have different optimum values for different operating conditions, including different process conditions, different program/erase cycles, different retention times, different temperatures, different disturb conditions, or combinations thereof. For a given storage scheme, the memory system, at the controller side, and/or at the memory die side, may maintain a data structure, such as a table, that identifies one or more sets of read threshold levels for the power control circuit 160 to use to bias the word lines during read operations. The data structure may include multiple sets of read threshold levels; each corresponding to a different area of the memory dies 104.

The memory system 100 may be configured to perform a read threshold calibration process that updates or revises one or more sets of the read threshold levels maintained in the data structure to more optimal values corresponding to changes in operating conditions. In various embodiments described herein, the read threshold calibration process that the memory system 100 performs may be based on bit error rates (BERs) determined from data read from the memory dies 104. The data read from the memory dies 104 to perform the calibration may be performed in response to host read requests. In addition or alternatively, the calibration may be a continuous process, such as a process continuously performed as host read requests are received, rather than as a discrete background process triggered by a certain metric, such as program/erase cycle count, as an example. Also, the calibration process may leverage the way in which the read/write circuit 144 reads data based on pages (e.g., lower, middle, upper) in order to determine voltage bins across a threshold voltage range over which the threshold voltage distribution curves extend, and BERs for those bins. Based on the determined BERs, the memory system 100 may determine in which direction to shift a read voltage level (increase or decrease), and by how much.

In further detail, the read/write circuit 144 may execute a read operation to read one or more pages of data from the memory dies 104. To do so, the read/write circuit 144 may execute the read operation in a sequence of stages dependent on the page types. For example, to read data from a page of MLC cells configured to store two bits-per-cell, the read/write circuit 144 may read the lower page first in a first stage, and then the upper page in a second stage. As another example, to read data from a page of MLC cells configured to store three bits-per-cell, the read/write circuit 144 may read the lower page first in a first stage, then the middle page in a second stage, and then the upper page in a third stage.

To read a given page, sense circuits of the sense blocks 146, coupled to the memory cells storing the page, perform a predetermined number of sense operations, each with the word lines coupled to the memory cells biased at an associated one of the read threshold voltage levels Vr. For an SLC storage scheme, the power control circuit 160 biases the word lines with the threshold voltage VrA associated with program state A, and the sense circuits perform a single sense operation. In response to the sense operation, the sense circuits identify those SLC cells in the erase state Er as storing a logic 1 value, and identify those SLC cells in memory state A as storing a logic 0 value.

For MLC storage schemes, to read a given page, sense circuits coupled to the memory cells storing the page perform multiple sense operations, such as two, three, or four sense operations, each with the word lines biased at a different one of the read threshold voltage levels Vr. The read threshold levels Vr that are applied depend on how many bits-per-cell the MLC cells are storing, which page is being read, and which number sense operation is being performed. In one example three bits-per-cell MLC storage scheme, to read a lower page, the sense circuits perform two sense operations, including a first sense operation with the word lines biased at the read threshold level VrA associated with memory state A, and a second sense operation with the word lines biased at the read threshold level VrE associated with memory state E. Read threshold voltage levels VrA and VrE applied during first and second sense operations are illustrated in FIG. 6.

Figure 6:
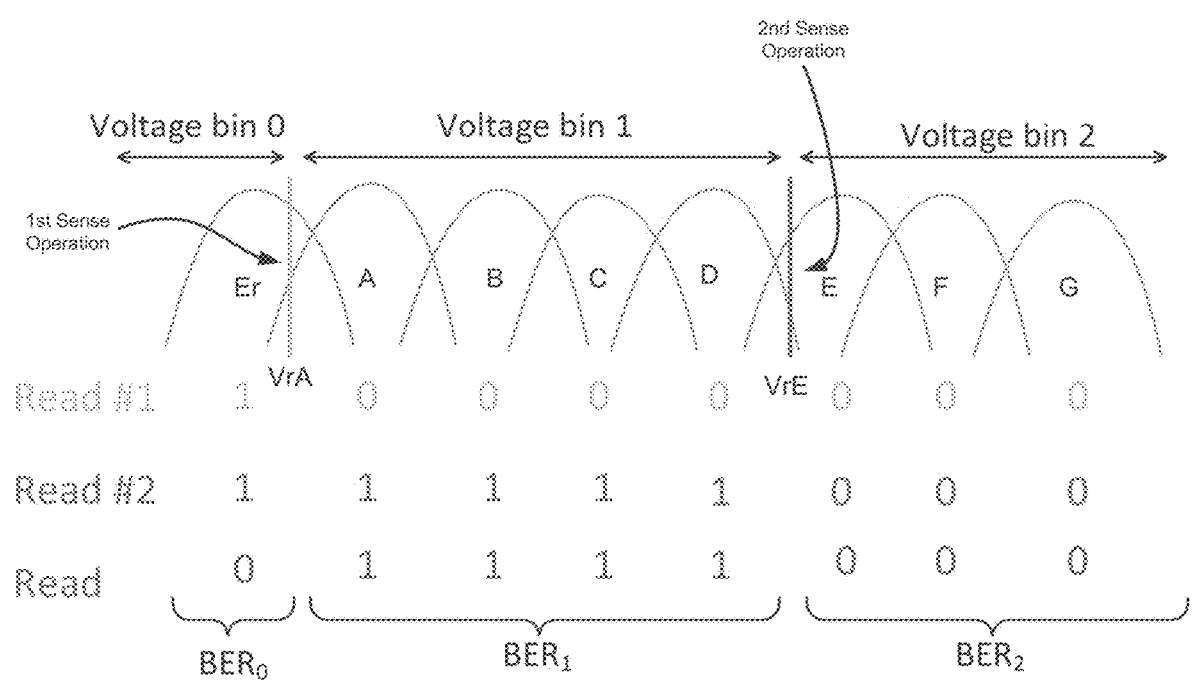
FIG. 6 generally illustrates a diagram illustrating multiple sense operations performed to read a lower page of data stored in three bits-per-cell MLC cells, three voltage bins formed from two read threshold levels, and decoded NOT XOR values determined from the two sets of pages generated from two sense operations.

As illustrated in FIG. 6, when the first sense operation is performed, the sense circuits output a logic 1 for MLC cells in the erase state Er, and output a logic 0 for MLC cells in memory states A through G. When the second sense operation is performed, the sense circuits output a logic 1 for MLC cells in the erase state Er and memory states A through D, and output a logic 0 for MLC cells in memory states E through G. In various example embodiments, the read/write circuit 144 (or other circuitry on the memory die 104, such as the control logic 154, for example) may perform a NOT XOR (NXOR) operation between the logic bit values of the first sense operation and the logic bit values of the second sense operation, to generate the read bit values for the lower-page bits.

In some embodiments, the memory die 104 may communicate to the controller 102, the read (lower) page (e.g., the page resulting from the NXOR operation) during a standard read operation. Additionally, or alternatively, the memory die 104 communicates the multiple pages corresponding to the individual sensing results during a special read operation designated for calibrating the read thresholds, as described herein. During a special read operation, the multiple transferred pages may be used by the controller 102 in order to compute the read page by NXORing the individual sensing result pages.

The ECC module 124 then decodes the read page in order to generate the decoded page. After ECC module 124 decodes the read page, the controller 102 may be configured to calculate an error page by comparing (e.g., XORing) the read page and the decoded page. Then, based on the error page and the individual sensing result pages, the controller 102 may compute the number of errors Ej or the Bit Error Rate BERj for each voltage bin j, by counting each error in the error page (e.g., each bit within the error page which is equal to 1) in the corresponding voltage bin counter (e.g., as determined by the corresponding values of the individual sensing result pages).

For example, if, for a certain memory cell, the individual sensing results are 11→ read value=NXOR(1,1)=1 and the decoded value is 0 (e.g., indicating an error), then the controller 102 increments the counter E0 (→BER0) corresponding to voltage bin 0. If, for a certain memory cell, the individual sensing results are 01→ read value= NXOR(0,1)=0 and the decoded value is 1 (indicating an error), then the controller 102 increments the counter E1 (→ BER1) corresponding to voltage bin 1. If, for a certain memory cell, the individual sensing results are 00→ read value=NXOR(0,0)=1 and the decoded value is 0 (indicating an error), then the controller 102 increments the counter E2 (→ BER2) corresponding to voltage bin 2.

The read/write circuit may perform sense operations in a similar manner to read the middle page and the upper page in order to complete execution of the read operation. For each of the middle page and the upper page, the number of sense operations performed may be different and/or the read threshold voltage levels applied to the bit lines may be different. In one example three bits-per-cell storage scheme, the sense circuits perform three sense operations to read a middle page, and two sense operations to read an upper page. However, the decoding operation is generally the same—for a given middle stage or upper stage, the read/write circuit 144 may perform NXOR operations on the bit values determined from the multiple sense operations to generate a read middle page and a read upper page.

Figure 7A:
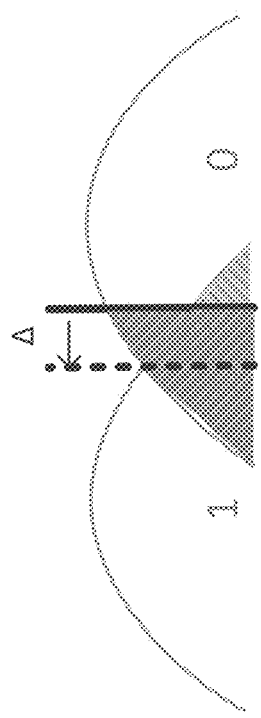
FIG. 7A generally illustrates a diagram illustrating decreasing the read threshold level for SLC, where the BER associated with changing logic 1 to logic 0 is greater than the BER associated with changing the logic 0 to logic 1.
Figure 7B:
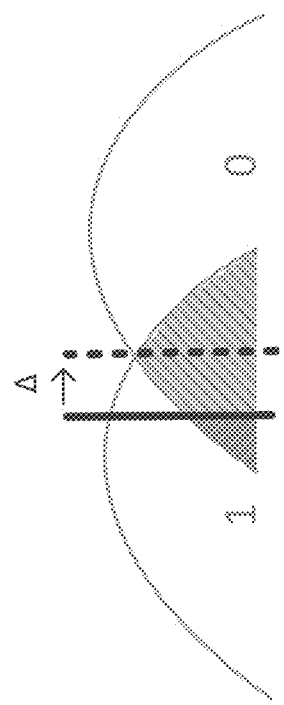
FIG. 7B generally illustrates a diagram illustrating increasing the read threshold level for SLC, where the BER associated with changing logic 1 to logic 0 is less than the BER associated with changing the logic 0 to logic 1.

As mentioned, the controller 102 determines how to adjust or revise read threshold voltage levels based the BER of read pages of data. For SLC storage schemes, when a page of data is read, the ECC module 124 may perform an error correction operation that corrects erroneous bits by flipping bit values from logic 1 to logic 0, and from logic 0 to logic 1. During the error correction operation, the ECC module 124 may keep track of a first count that counts the number of bits changed from logic 1 to logic 0, and keep track of a second count that counts the number of bits changed from logic 0 to logic 1. The first and second counts are indicative of the bit error rate BER, and in turn can be used to determine in what direction and how much to move the read threshold level VrA. If the number of bits changed from logic 1 to logic 0 (first count) is greater than the number of bits changed from logic 0 to logic 1 (second count), then the ECC module 124 (or another component within the memory system 100) may decrease the read threshold level VrA (move left), as indicated in FIG. 7A. In addition, if the number of bits changed from logic 1 to logic 0 (first count) is less than the number of bits changed from logic 0 to logic 1 (second count), then the ECC module 124 (or another component within the memory system 100) may increase the read threshold level VrA (move right), as indicated in FIG. 7B.

Adjusting read threshold levels based on BER for MLC storage schemes involving multiple sense operations to read a single page (e.g., lower, middle, upper, etc.) becomes more complicated since a single comparison between two counts cannot be performed. For example, referring back to FIG. 6, when reading a lower page in a three bits-per-cell storage scheme, when a decoder flips a bit value from logic 0 to logic 1, the decoder does not know, without more information, whether the flip corresponds to the A read threshold level VrA or the E read threshold level.

In order to gain more information, the controller 102 divides the threshold voltage range into voltage bins defined by the read threshold levels, and determines BERs for the different voltage bins. Additionally, or alternatively, the controller 102 receives the lower page bits from both the first and the second sense operations before the NXOR operation is performed, so the controller 102 can determine the voltage bin to which each bit belongs. By knowing the voltage bins to which each bit belongs, the controller 102 can then update accurate counts to adjust the BERs, and in turn the threshold voltage level adjustments accordingly.

To illustrate, as indicated in FIG. 6, the A and E threshold voltage levels used for the first and second sense operations divide the threshold voltage distribution curves into three voltage bins. Voltage bin 0 includes the erase state Er voltage distribution curve. Voltage bin 1 includes the voltage distribution curves for memory states A through D. Voltage bin 2 includes voltage distribution curves for memory states E through G.

To determine the voltage bins, the controller 102 receives the lower page bits from both the first and second sense operations, instead of (or in addition to) a read lower page bits based on an NXOR operation in order to differentiate bits in Voltage bin 0 from Voltage bin 2. For example, for a given bit, if the combined bit value indicated from the first and second sense operations is "11" then the controller 102 knows that given bit is in Voltage bin 0. On the other hand, for a given bit, if the combined bit value indicated from the first and second sense operations is "00" then the controller 102 knows that the given bit is in Voltage bin 2.

After identifying the voltage bins for each of the lower page bits, the controller 102 may then perform the NXOR operation to generate the read lower page. The controller 102 may then perform error correction via the ECC module 124 by flipping bit values of bits. Based on the decoding results and the individual sensing pages, the controller 102 may compute three BER counts, a first count for Voltage bin 0, a second count for Voltage bin 1, and a third count for Voltage bin 2. The first count may indicate a $BER_0$ associated with Voltage bin 0, the second count may indicate a $BER_1$ associated with Voltage bin 1, and the third count may indicate a $BER_2$ associated with Voltage bin 2.

When the ECC module 124 determines to change a bit having a logic 0 to a logic 1, the controller 102 may determine whether the bit is in Voltage bin 0 or Voltage bin 2. If the bit is in Voltage bin 0, then the controller 102 may update the first count. If the bit is in Voltage bin 2, then the controller 102 may update the third count. Additionally, or alternatively, if the ECC module 124 determines to change a bit having a logic 1 to a logic 0, then the controller 102 may update the second count associated with Voltage bin 1.

In addition, in order to determine how to adjust both the A read threshold level VrA by a first $\Delta_1$ and the E read threshold level VrE by a second $\Delta_2$, the controller 102 may separate the second count associated with $BER_1$ into two sub-counts, including a left sub-count for determining the first $\Delta_1$, and a right sub-count for determining the second $\Delta_2$.

In some example configurations, the controller 102 may divide the second count in half, with one half of the second count used for the left sub-count, and a second half of the second count used for the right sub-count. In other example configurations, the sense circuits may perform an additional, third sense operation with the word lines biased with the C read threshold voltage level VrC, which in turn divides Voltage bin 1 into left and right sub-bins. The controller 102 may then maintain two sub-counts, one for each sub-bin. During error correction, if the controller 102 determines to change a bit from a logic 1 to a logic 0, the controller 102 determines the sub-bin the bit belongs, and updates the sub-count accordingly.

In doing so, the controller 102 has now created two SLC situations—i.e., the decoder can perform two BER comparisons, one to determine the first $\Delta_1$ for the A read threshold level VrA, and a second to determine the second $\Delta_2$ for the E read threshold level VrE.

The controller 102 may further implement similar processes that determine BERs and adjustment $\Delta$ based on the BERs during reading of the other (middle, upper, higher, etc.) pages. Additionally, or alternatively, these functions are not limited to only three-bits per cell storage schemes, but can similarly be implemented for other MLC storage schemes, including two bits-per-cell and four bits-per-cell.

Figure 8:
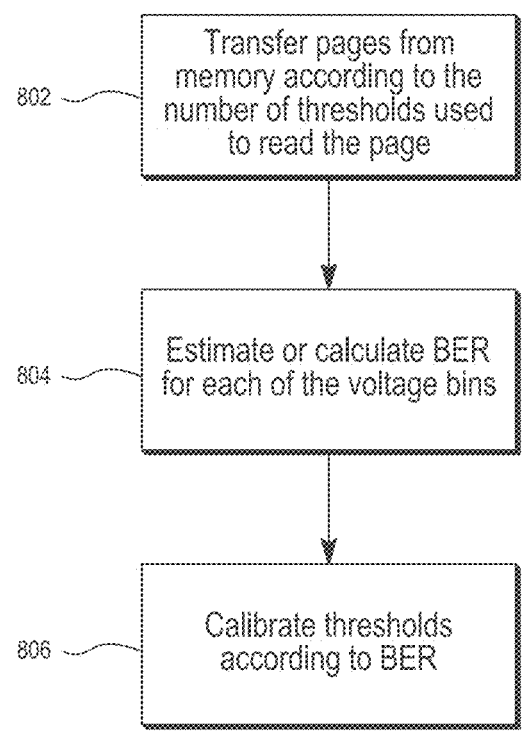
FIG. 8 generally illustrates a flow chart of an example method of calibrating read threshold voltages.

FIG. 8 generally illustrates a flow chart of an example method of calibrating read threshold voltages. At block 802, the memory dies transfer pages to the controller according to the number of read threshold voltages that are used to read the page. For example, as previously described with respect to FIG. 6, to read a lower page of three bits-per-cell MLC, two sense operations are performed, resulting in two pages that are transferred to the controller.

At block 804, BER for each voltage bin is calculated or estimated. In some example configurations, where the decoder is able to successfully correct all the bits, the BERs may be determined by counting the number of bits to be flipped from logic 0 to logic 1, and from logic 1 to logic 0, tracking which bins to which the flipped bits belong. In other example configurations, if the decoding fails and BERs cannot be calculated, and instead are estimated, various types of BER estimation may be employed. For example, the ECC module 124 may use the syndrome weight (e.g., a sum of the number of unsatisfied parity checks) to estimate the BERs. Other embodiments that estimate BER through estimation of memory error models may also be used. In some methods, estimating BER instead of calculating actual values may be performed where decoding fails and actual BER cannot be derived from the results of the decoding. At block 806, the ECC module 124 may adjust or update the read threshold levels according to the BER calculate at block 804. The flow described in FIG. 8 may be applied periodically or based on some indication, such as elevated BER levels observed in the controller system, which triggers a Read Level Tracking (RLT) flow. The RLT flow may use a special read operation in which the multiple sensing pages are transferred separately and an internal NXOR operation inside the memory die is omitted (and hence incur extra page transfer operations). For conventional read operations, which do not apply the flow of FIG. 8 for read thresholds calibration, the multiple sensing pages are NXORed internally inside the memory die and a single read page is transferred to the controller.

Accordingly, this method of calibrating the read threshold levels relies on the extraction of the individual sensing pages before the NXOR operation is performed within the memory. The NXOR operation performed inside the memory reduces the number of unnecessary transfers to read a page. However, in this method, all of the individual sensing pages are transferred separately. Doing so does not add significant resources since transferring data from the memory dies to the controller consumes much less time compared to sense operations.

The method provides improvements compared to other read threshold calibration techniques, such as algorithms that generate a histogram of the Cell Voltage Distribution (CVD) and find the valley points of the histogram, which will serve as the read thresholds, or algorithms that rely on the ECC feedback in order to identify the read thresholds that minimize the BER. These methods incur relatively high latency penalty, as they require performing a relative large number of reads. In order to cover a voltage range sufficient for calibration of a single page, the number of reads performed for these other threshold calibration techniques is usually large (e.g., at least 5).

In the present method is a read threshold calibration method based on calculating the threshold offsets to the actual or estimated BER. The calibration method may use only one page read at regular thresholds, with several transfers of data (one transfer per threshold involved in page sensing). The present calibration method leverages existing host reads as opposed to issuing dedicated reads in order to perform continuous read level tracking. In turn, the controller 102 does not need to stop or pause the continuous read flow to calibrate the read threshold levels when the present method is performed. The present calibration method may be especially advantageous when calibrating for read thresholds associated with four bits-per-cell storage schemes (QLC), which requires multiple sense operations that incur high latency. The present calibration method will enable more frequency read thresholds calibration and would improve real time accuracy, reduce BER, power, read latency, and increase performance.

In further detail, the present calibration method is centered on receiving BER per voltage bin (in case of successful decode) or estimating the BER per voltage bin. For SLC embodiments, if the BER of the SLC cells that were programmed to 0 and the BER of the cells programmed to 1 is known, the controller 102 finds the location where the read threshold should be located, assuming Gaussian state distribution. In SLC, both voltage bins (1 and 0) are available from a regular read (1 threshold for 1 page).

However, when each page is represented by several reading thresholds, the BER in each voltage bin can only be calculated if the voltage bins are distinguished by something else than their logical value. If two thresholds are needed to determine the logical value of the bit (for example LP or UP of TLC), reads of both thresholds should be used to determine the BER in the voltage bins.

Accordingly, the present calibration method relies on both reads transferred to the controller, so that information regarding the individual voltage bins can be inferred. In some embodiments, the extra transfers may be implemented through a "Single state read" command to NAND when Read Level Tracking (RLT) is required, without interrupting read with cache. The (calculated or estimated) BER of each of the voltage bins will be used to determine voltage shifts $\Delta$ of each of the thresholds used to read the page.

Figure 9:
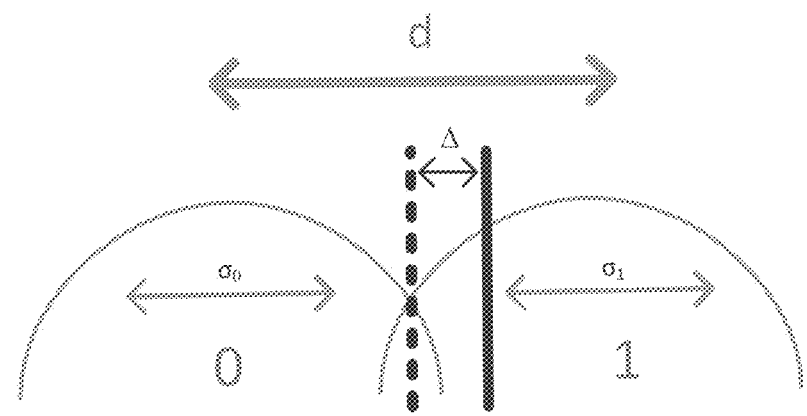
FIG. 9 generally illustrates a zoomed-in view of a single read threshold voltage, illustrating how $\Delta$ may be determined.

FIG. 9 illustrates how $\Delta$ may be created when BER is known after a successful decode (or error correction). The present calibration method can be used to calibrate read thresholds after a successful ECC decode, when the BER of each voltage bin can be derived from calculating the number of FBC in each voltage bin. Each of the bits is mapped to its voltage bin according to the results of the single threshold reads, the bits that are in error are summed per voltage bin (Block #804 in Figure #8), and the error vector is passed to the module that calculates the read thresholds according to the BER per voltage bin.

FIG. 9 zooms in on a single threshold. In FIG. 9, d is the distance between the centers of 2 states, $\sigma_0$ and $\sigma_1$ are the standard deviations of the corresponding states. $\Delta$ here is distances of the current read threshold (solid) from the optimal read threshold (dashed). N is the number of cells in a page, and N/8 is the total number of cells that are programmed in a single state, assuming scrambling. Since the decoding was successful, the number of cells in each state may also be counted explicitly. $E_0$ and $E_1$ are the number of bits in error in each of the bins, so that $P_0$ and $P_1$ are the BER in each of the voltage bins.

Using the Gaussian tail distribution function Q, it can be derived that $$P_0 = Q\left(\frac{d/2 - \Delta}{\sigma_0}\right) => d/2 - \Delta = \sigma_0 \cdot Q^{-1}(P_0)$$
$$P_1 = Q\left(\frac{d/2 - \Delta}{\sigma_1}\right) => d/2 - \Delta = \sigma_1 \cdot Q^{-1}(P_1)$$

Separating $\Delta$, we get $$\Delta = \frac{\sigma_1 \cdot Q^{-1}(P_1) - \sigma_0 \cdot Q^{-1}(P_0)}{2}$$

To simplify the computation, one may assume that $\sigma_1 = \sigma_0 \sigma$.

$$\Delta = \frac{\sigma(Q^{-1}(P_1) - Q^{-1}(P_0))}{2} > \frac{\sigma_{min}(Q^{-1}(P_1) - Q^{-1}(P_0))}{2}$$

In the above expressions, $\sigma_{min}$ is assumed such that $\sigma_{min} < \sigma_1$ and $\sigma_{min} < \sigma_0$ both. This can be derived offline and modified during the lifetime of the device as $\sigma$ is expected to grow higher with the PEC. However, the exact knowledge of $\sigma$ is not required at this stage, as it is a positive number, and will only effect the amplitude of $\Delta$ rather than its sign.

For a single threshold, the above expression provides a calculation of $\Delta$, which can be used to successfully tune the read thresholds of an SLC page given the error rates in the voltage bins. However, for MLC, TLC, or QLC, several thresholds are involved when reading a single page. From an example of TLC LP on FIG. 6, BER #1 and BER #3 are computed exactly, but BER #2 is split between the 2 thresholds that constitute LP read.

To cope with the inability to separate BER #2 explicitly, 2 ways are proposed. First, an arbitrary equal division of BER #2 between the 2 thresholds may be assumed, which is a reasonable assumption. On the other hand, another read may be taken at a threshold in the center of bin #2. This will improve the results of the RLT operation, while incurring extra sense and transfer.

The sensing itself may be operated through a NAND command that is designed to read a page with an extra threshold.

For example, if the system operates an RLT step on LP, it may conduct a special MP read by sensing at the 2 thresholds of the LP and an additional sense in the middle of the window (3 sense overall, like MP). All 3 pages will be transferred to the controller, and RLT will be conducted.

When the system intends to operate an RLT step on MP (which is constituted of 3 thresholds and 4 voltage bins), it needs 2 more reads to separate the 2 voltage bins shared between thresholds. It may either conduct only 1 additional read (which may employ a QLC 4 page combined read) or conduct 2 additional reads for maximum precision.

The choice between the operation modes may be controlled by system factors such as overall BER, temperature, PEC, and the like.

Figure 10:
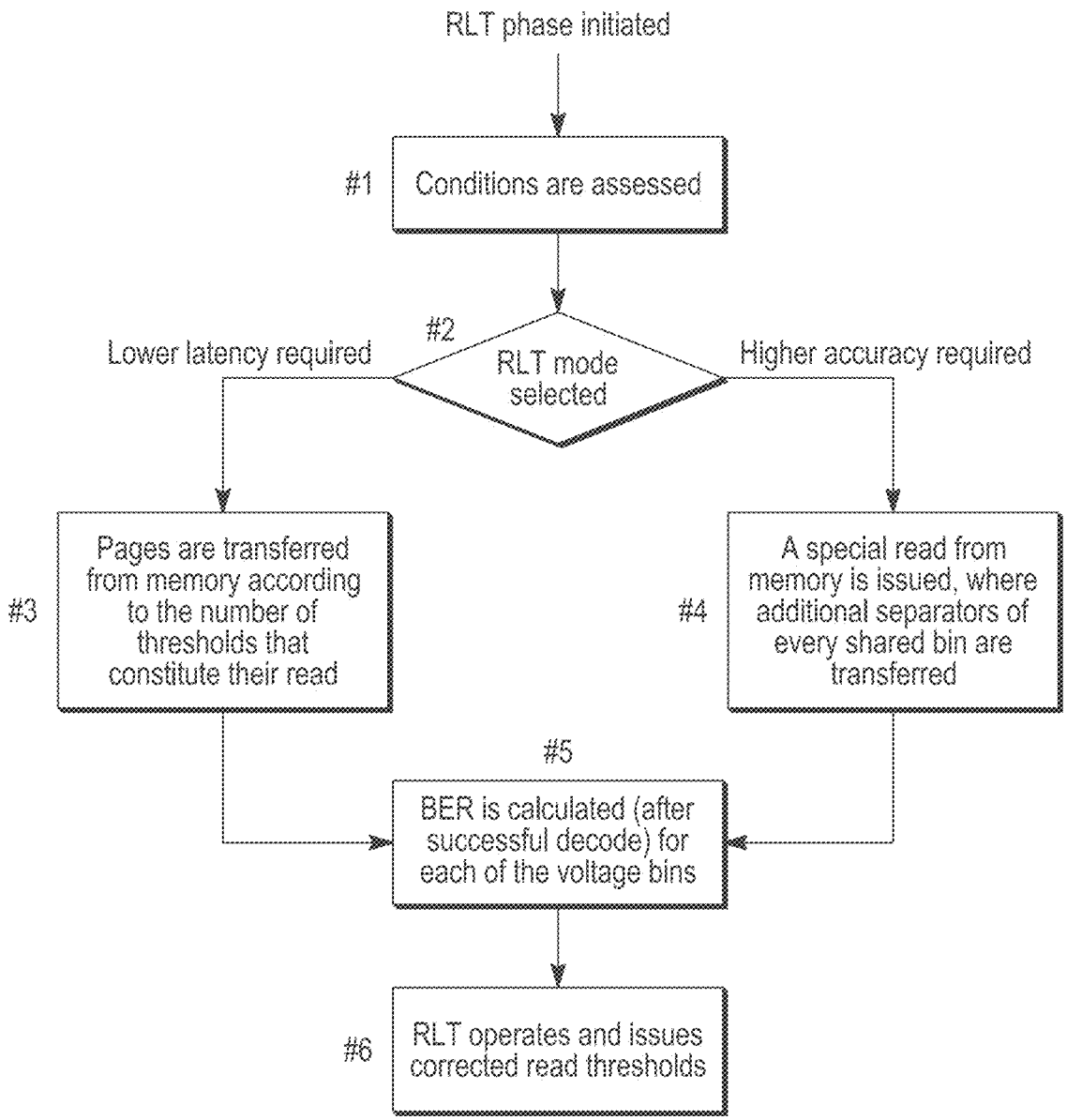
FIG. 10 generally illustrates a flow chart of another example method of calibrating read threshold levels.

FIG. 10 generally illustrates a flow chart of another example method of calibrating read threshold levels. In Block #1, the described conditions are assessed, and the operation mode is selected. If a higher accuracy is required, and special conditions are expected such as Xtemp, the extra read RLT mode may be selected in Block #2 (right path). On the other hand, if the BER was low and only a routine tracking operation is needed, no extra reads mode should be selected (left path).

In Block #3, pages according to the number of sensed thresholds are passed (2 for LP, 3 for MP, 4 for QLC pages and so on). This should not have substantial impact on latency, as only extra transfer latency is incurred.

In Block #4, extra pages that separate the shared voltage bins are sensed and transferred. This may be done by either a special memory read command, or a series of regular read commands issued by the controller. In any case, although the higher latency in relation to Block #3, the overall latency is much lower than the traditional read threshold calibration, such as BES. In this invention, it is assumed that successful decode occurs at Block #5. Then, the process of read threshold calibration takes place based on the calculation described above.

The present calibration method may be implemented as a hardware (HW) or firmware (FW). A lookup table based on the inverse Q function may be needed to implement the calculation.

Additionally, or alternatively, the present calibration method may be implemented iteratively, to reach optimized results. In some embodiments, applying the above present calibration method several times, using corrected read thresholds for the next reads and applying another RLT operation will correct the thresholds better than a single RLT operation. Additionally, or alternatively, in some embodiments, the same word lines (WLs) do not have to be used, but rather WLs that belong to blocks which exhibit similar conditions (have the same program/erase count, were programmed at roughly the same time and temperature, etc.).

Figure 11A:
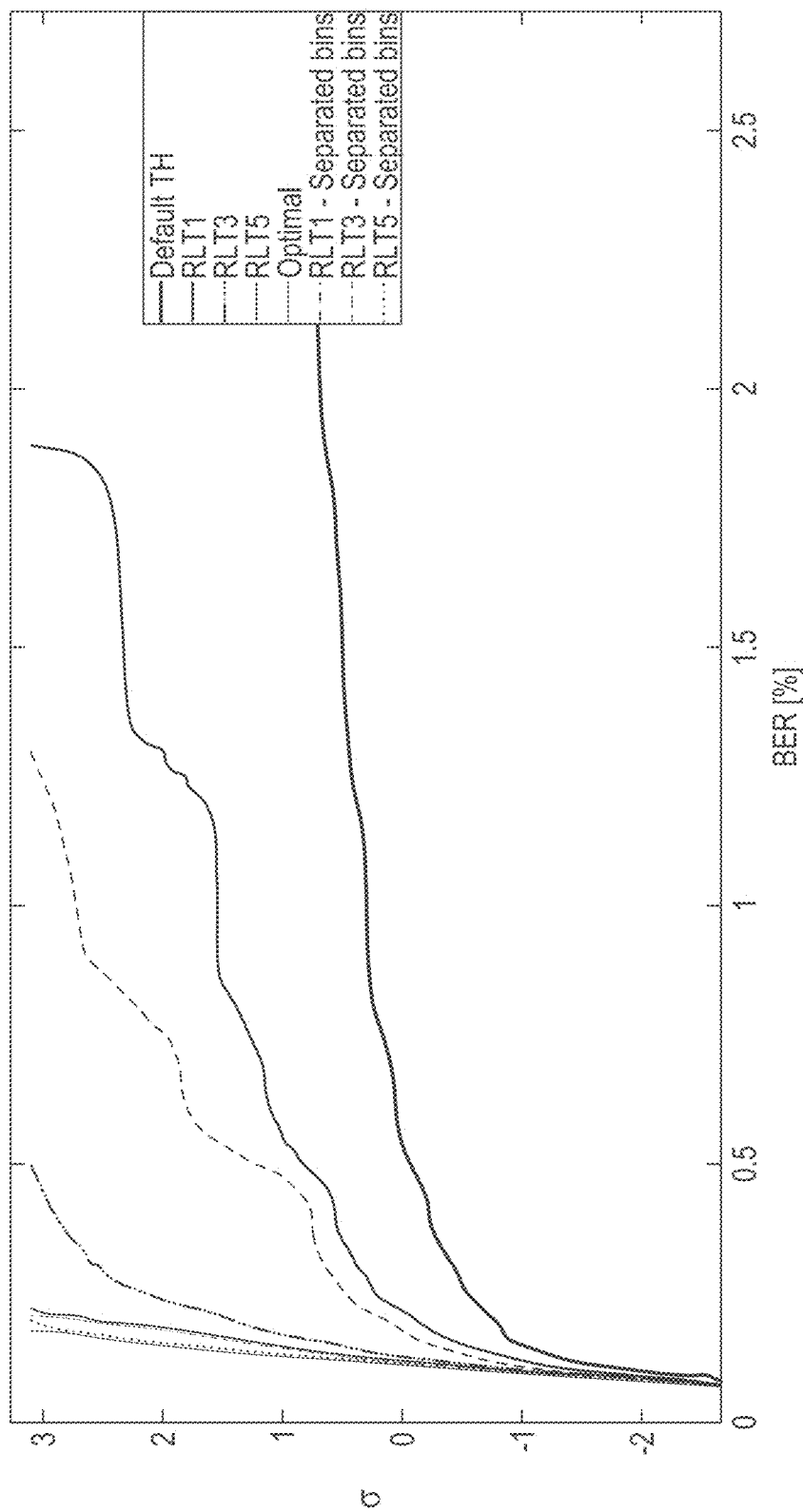
FIG. 11A generally illustrates a sigma plot versus calculated BER for a lower page, illustrating iterative improvements in the read threshold levels.
Figure 11B:
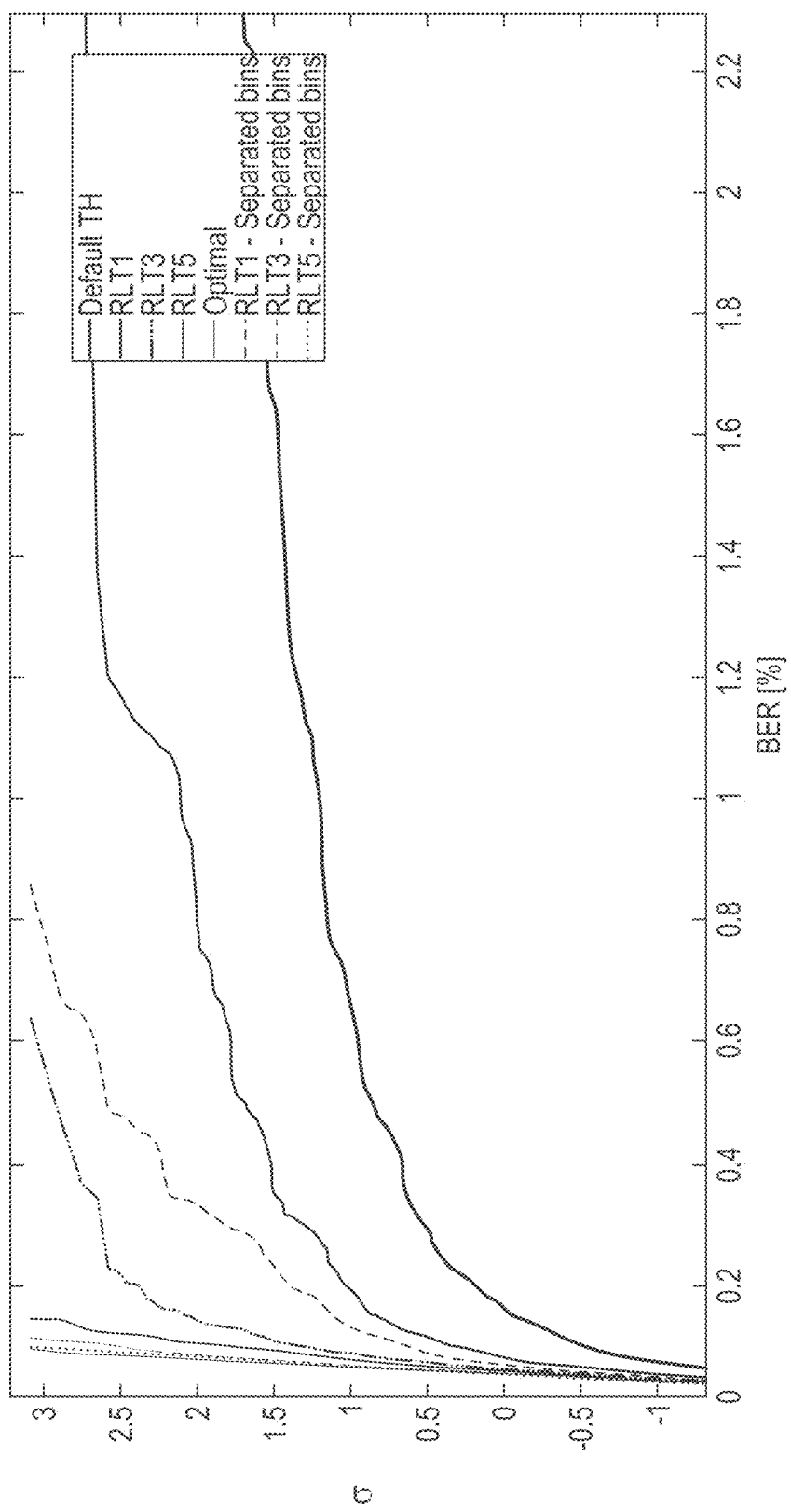
FIG. 11B generally illustrates a sigma plot versus calculated BER for an upper page, illustrating iterative improvements in the read threshold levels.

The results of performing the present read threshold calibration is represented by the sigma plots in FIGS. 11A and 11B, which generally illustrate BER at calibrated read thresholds for X3 LP (FIG. 11A) and UP (FIG. 11B). These plots show the probability (e.g., in sigmas) to get each BER value according to the various evaluated schemes. The different curves are BER with default read thresholds (blue, rightmost curve), BER with optimal read thresholds (black, leftmost curve), and BER with thresholds calibrated through the present calibration method. The RLT1 curve implies a single RLT operation, while RLTx implies x consecutive x operations. Both results that do not incur extra reads (solid curves in FIGS. 11A, 11B) and the higher accuracy extra reads (dotted curves in FIGS. 11A, 11B) are drawn. The graph shows that several consecutive RLT operations will move the read thresholds to optimal levels.

Additionally, or alternatively, separating the shared bins by an extra read will improve performance further and reach the optimal thresholds faster, as demonstrated by the dotted lines compared to the solid lines on FIG. 11 However; this incurs an additional sense and transfer from the device.

As previously described, in some embodiments, the BER is estimated instead of calculated. For such embodiments, the BER per voltage bin is estimated rather than calculated. Estimating BER can be useful when decoding is not possible due to high BER, or in a situation where decoding result is not needed, but only the read threshold calibration is required.

In this embodiment, a system based on bitwise syndrome vector may be involved to estimate the memory error model (MEM). Once the MEM is estimated, it can be supplied to the threshold calibration module and thresholds can be acquired.

Figure 12:
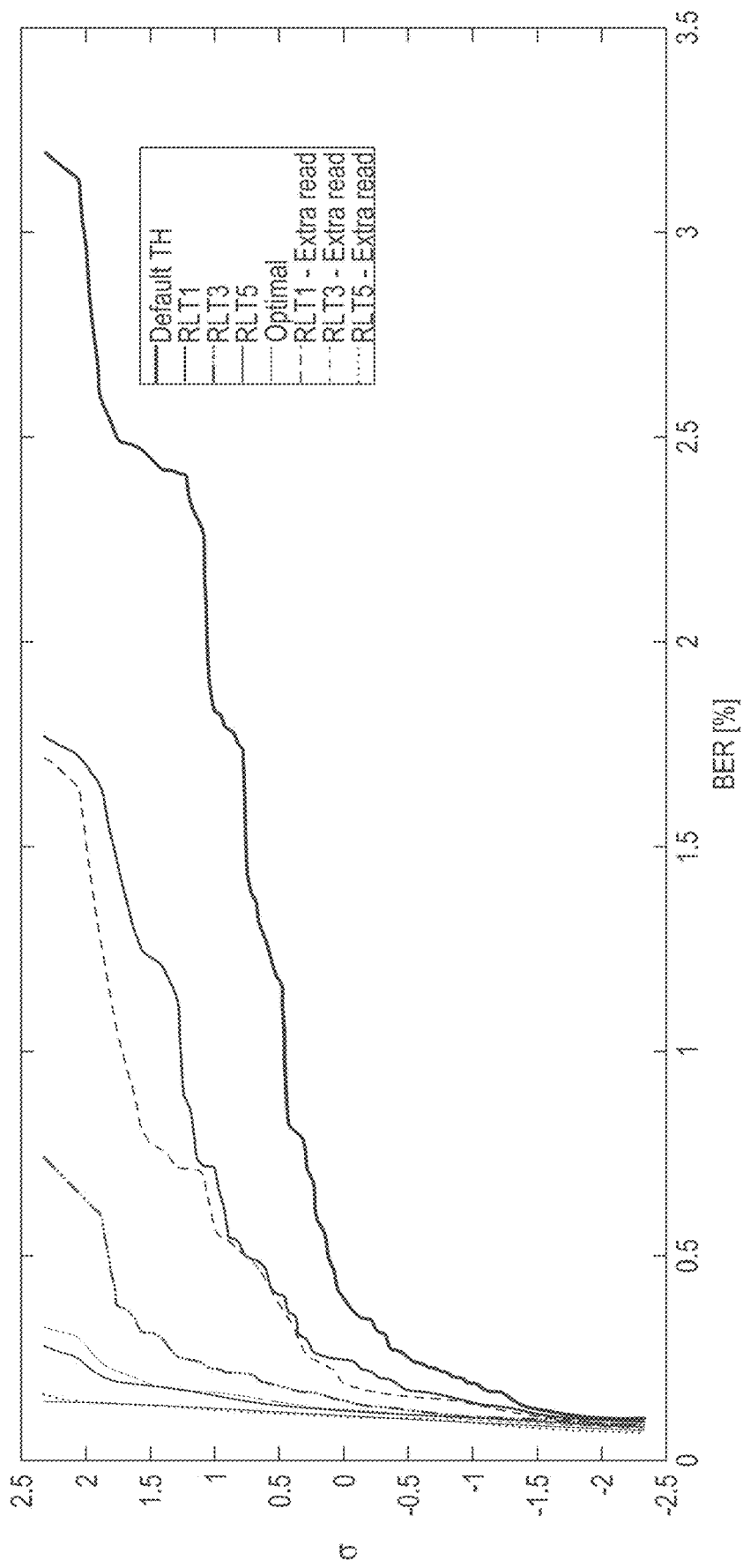
FIG. 12 generally illustrates a sigma plot versus estimated BER, illustrating iterative improvements in the read threshold levels.

FIG. 12 generally illustrates sigma plots, illustrating the results of the present calibration method when BER is estimated. The different curves on the figures are BER with default read thresholds (blue, rightmost curve), BER with optimal read thresholds (black, leftmost curve) and BER with thresholds calibrated through the present calibration method, using estimated memory error model (MEM) in case of decoding failure, with (dotted) and without (solid) an extra read to separate the bins, as previously described. These results show that even estimation of the memory error model (MEM) can show sufficient improvement over the default read thresholds, in case decoding fails.

In other estimation embodiments, the decoder estimates BER per voltage bin during decoding. This estimation can be useful to calibrate the read thresholds in case decoding eventually fails and BER cannot be derived from the results of decoding.

These embodiments use an estimation method based on estimation of a memory error model (MEM) during decoding. The voltage bins in this embodiment are not related to soft information, but rather use the function, which allows us to group bits (all bits that belong to the same voltage bin belong to the same distinct group) and then use the decoder's intermediate results to estimate the MEM.

In sum, the present calibration method allows read threshold calibration based on only a single memory read which greatly shortens the process compared to other known methods. This holds a major advantage to system design, as read thresholds calibration can occur more frequently. As such, it allows better overall QoS, throughput and power consumption.

In some embodiments, a method for calibrating read threshold voltages includes receiving, from at least one memory die, a number of page bits corresponding to a number of read operations performed on a page associated with the at least one memory die. The method further includes determining voltage bins for each bit of the number of page bits. The method further includes determining, for each voltage bin, a bit error rate. The method further includes adjusting read threshold voltages associated with the at least one memory die using the bite error rate for each voltage bin.

In some embodiments, determining, for each voltage bin, the bit error rate includes flipping logical values associated with each of the bits of the number of page bits from a first logical value to a second logical value. In some embodiments, determining, for each voltage bin, the bit error rate includes estimating the bit error rate for each voltage bin using corresponding syndrome weights. In some embodiments, the read operations include existing host read operations. In some embodiments, adjusting the read threshold voltages associated with the at least one memory die using the bit error rate for each voltage bin includes determining a voltage shift value for each read threshold voltage. In some embodiments, determining the voltage shift value for a respective read threshold voltage includes calculating a Gaussian tail distribution function using the bit error rate associated with a respective voltage bin, wherein the respective voltage bin corresponds to the respective read threshold voltage. In some embodiments, adjusting the read threshold voltages associated with the at least one memory die using the bit error rate for each voltage bin includes shifting each read threshold voltage by respective voltage shift values. In some embodiments, memory cells associated with the at least one memory die include single-level cells. In some embodiments, memory cells associated with the at least one memory die include multi-level cells.

In some embodiments, a memory system includes a non-volatile storage and a controller. The non-volatile storage includes at least one memory die and the controller is in communication with the at least one memory die. The controller is configured to: receive, from the at least one memory die, a number of page bits corresponding to a number of read operations performed on a page associated with the at least one memory die; determine voltage bins for each bit of the number of page bits; determine, for each voltage bin, a bit error rate; and adjust read threshold voltages associated with the at least one memory die using the bite error rate for each voltage bin.

In some embodiments, the controller is further configured to determine, for each voltage bin, the bit error rate by flipping logical values associated with each of the bits of the number of page bits from a first logical value to a second logical value. In some embodiments, the controller is further configured to determine, for each voltage bin, the bit error rate by estimating the bit error rate for each voltage bin using corresponding syndrome weights. In some embodiments, the read operations include existing host read operations. In some embodiments, in the controller is further configured to adjust the read threshold voltages associated with the at least one memory die using the bit error rate for each voltage bin by determining a voltage shift value for each read threshold voltage. In some embodiments, the controller is further configured to determine the voltage shift value for a respective read threshold voltage by calculating a Gaussian tail distribution function using the bit error rate associated with a respective voltage bin, wherein the respective voltage bin corresponds to the respective read threshold voltage. In some embodiments, the controller is further configured to adjust the read threshold voltages associated with the at least one memory die using the bit error rate for each voltage bin by shifting each read threshold voltage by respective voltage shift values. In some embodiments, memory cells associated with the at least one memory die include single-level cells. In some embodiments, memory cells associated with the at least one memory die include multi-level cells.

In some embodiments, a system for calibrating read threshold voltages includes a controller in communication with at least one memory die. The controller is configured to: receive, from the at least one memory die, a number of page bits corresponding to a number of read operations performed on a page associated with the at least one memory die, wherein the read operations include existing host read operations; determine voltage bins for each bit of the number of page bits; determine, for each voltage bin, a bit error rate; and adjust read threshold voltages associated with the at least one memory die using a Gaussian tail distribution function and the bit error rate for each voltage bin, wherein each voltage bin corresponds to a respective read threshold voltage.

In some embodiments, memory cells associated with the at least one memory die include multi-level cells.

It is intended that the foregoing detailed description be understood as an illustration of selected forms that the invention can take and not as a definition of the invention. It is only the following claims, including all equivalents that are intended to define the scope of the claimed invention. Finally, it should be noted that any aspect of any of the preferred embodiments described herein can be used alone or in combination with one another.

What is claimed is:

1. A method for calibrating read threshold voltages, the method comprising:
   performing a plurality of read operations on at least one memory die;
   for each memory state resultant from the plurality of read operations, determining a corresponding voltage bin of a plurality of voltage bins;
   determining, for each of the plurality of voltage bins, a bit error rate;
   calculating a Gaussian tail distribution function for each respective voltage bin using the bit error rate corresponding to the respective voltage bin;
   determining a distance of a read threshold associated with the at least one memory die from an optimal read threshold for each respective voltage bin using the Gaussian tail distribution function corresponding to the respective voltage bin; and
   adjusting the read threshold voltages using the distance of the read threshold from the optimal read threshold voltage for each of the plurality of voltage bins.

2. The method of claim 1, further comprising flipping logical values of erroneous bits associated with each of the plurality of voltage bins.

3. The method of claim 2, wherein the determining, for each of the plurality of voltage bins, the bit error rate, comprises, for each of the plurality of voltage bins, determining a first number of bits flipped from a first value to a second value and determining a second number of bits flipped from the second value to the first value.

4. The method of claim 3, wherein the adjusting the read threshold voltages comprises adjusting the read threshold voltages based on whether the first number is greater than the second number.

5. The method of claim 1, wherein the determining, for each of the plurality of voltage bins, the bit error rate, comprises, for each of the plurality of voltage bins, estimating the bit error rate using a corresponding syndrome weight.

6. The method of claim 1, wherein the performing the plurality of read operations comprises performing a plurality of host read operations.

7. The method of claim 1, wherein the adjusting the read threshold voltages comprises determining a voltage shift value for each respective read threshold voltage.

8. The method of claim 7, wherein the voltage shift value for each respective read threshold voltage is determined using the Gaussian tail distribution function for the respective voltage bin corresponding to the respective read threshold voltage.

9. The method of claim 7, wherein the adjusting the read threshold voltages further comprises shifting each respective read threshold voltage by the determined voltage shift value.

10. A controller comprising:
    a bus interface configured to receive, from at least one memory die, a result of a plurality of read operations performed on the at least one memory die; and
    a processor configured to:
       for each memory state resultant from the plurality of read operations, determine a corresponding voltage bin of a plurality of voltage bins;
       determine, for each of the plurality of voltage bins, a bit error rate;
       calculate a Gaussian tail distribution function for each respective voltage bin using the bit error rate corresponding to the respective voltage bin;
       determine a distance of a read threshold associated with the at least one memory die from an optimal read threshold for each respective voltage bin using the Gaussian tail distribution function corresponding to the respective voltage bin; and
       adjust the read threshold voltages using the distance of the read threshold from the optimal read threshold voltage for each of the plurality of voltage bins.

11. The controller of claim 10, wherein the processor is further configured to flip logical values of erroneous bits associated with each of the plurality of voltage bins.

12. The controller of claim 11, wherein the processor is further configured to determine, for each of the plurality of voltage bins, the bit error rate by determining a first number of bits flipped from a first value to a second value and determining a second number of bits flipped from the second value to the first value.

13. The controller of claim 12, wherein the processor is further configured to adjust the read threshold voltages by adjusting the read threshold voltages based on whether the first number is greater than the second number.

14. The controller of claim 10, wherein the processor is further configured to determine, for each of the plurality of voltage bins, the bit error rate by estimating the bit error rate using a corresponding syndrome weight.

15. The controller of claim 10, wherein the plurality of read operations comprise host read operations.

16. The controller of claim 10, wherein the processor is further configured to adjust the read threshold voltages by determining a voltage shift value for each respective read threshold voltage.

17. The controller of claim 16, wherein the processor is further configured to determine the voltage shift value for each respective read threshold voltage using the Gaussian tail distribution function for the respective voltage bin corresponding to the respective read threshold voltage.

18. The controller of claim 16, wherein the processor is further configured to adjust the read threshold voltages by shifting each respective read threshold voltage by the determined voltage shift value.

19. A system for calibrating read threshold voltages, the system comprising:
    a controller in communication with at least one memory die, the controller configured to:
       receive, from the at least one memory die, a result of a plurality of operations performed on the at least one memory die;
       for each memory state resultant from the plurality of read operations, determine a voltage bin of a plurality of voltage bins;
       determine, for each of the plurality of voltage bins, a bit error rate;
       calculate a Gaussian tail distribution function for each respective voltage bin using the bit error rate corresponding to the respective voltage bin;
       determine a distance of a read threshold associated with the at least one memory die from an optimal read threshold for each respective voltage bin using the Gaussian tail distribution function corresponding to the respective voltage bin; and
       adjust the read threshold voltages using the distance of the read threshold from the optimal read threshold voltage for each of the plurality of voltage bins, wherein each of the plurality of voltage bins corresponds to a respective read threshold voltage.

20. The system of claim 19, wherein the controller is further configured to determine, for each of the plurality of voltage bins, the bit error rate using a corresponding syndrome weight.

* * * * *